(12) United States Patent
Hayashi et al.

(10) Patent No.: US 8,922,683 B2
(45) Date of Patent: Dec. 30, 2014

(54) COLOR IMAGING ELEMENT AND IMAGING APPARATUS

(71) Applicant: FUJIFILM Corporation, Tokyo (JP)

(72) Inventors: Kenkichi Hayashi, Saitama (JP); Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 119 days.

(21) Appl. No.: 13/728,487

(22) Filed: Dec. 27, 2012

(65) Prior Publication Data

US 2014/0009647 A1 Jan. 9, 2014

(30) Foreign Application Priority Data

Jul. 6, 2012 (JP) .................. 2012-152815

(51) Int. Cl.
 *H04N 5/335* (2011.01)
 *H01L 27/146* (2006.01)
 *H04N 9/00* (2006.01)

(52) U.S. Cl.
 CPC ............ *H01L 27/14621* (2013.01); *H04N 9/00* (2013.01)
 USPC ............................ 348/275; 348/276; 348/279

(58) Field of Classification Search
 CPC ...................................................... H04N 5/335
 USPC .................................................. 348/272–279
 See application file for complete search history.

(56) References Cited

U.S. PATENT DOCUMENTS

| | | | |
|---|---|---|---|
| 5,307,159 A * | 4/1994 | Hieda | 348/235 |
| 5,555,464 A * | 9/1996 | Hatlestad | 348/266 |
| 6,343,146 B1 | 1/2002 | Tsuruoka et al. | |
| 7,146,042 B2 | 12/2006 | Chen | |
| 8,456,553 B2 | 6/2013 | Hayashi et al. | |
| 2002/0149686 A1 | 10/2002 | Taubman | |
| 2006/0203113 A1 | 9/2006 | Wada et al. | |
| 2007/0153104 A1 | 7/2007 | Ellis-Monaghan et al. | |
| 2008/0151083 A1 | 6/2008 | Hains et al. | |

(Continued)

FOREIGN PATENT DOCUMENTS

| | | | |
|---|---|---|---|
| EP | 1 357 760 A1 | 10/2003 | |
| EP | 1 793 620 A1 | 6/2007 | |

(Continued)

OTHER PUBLICATIONS

Chinese Office Action, dated May 23, 2013, for Chinese Application No. 201180022503.3.

(Continued)

*Primary Examiner* — Tuan Ho
(74) *Attorney, Agent, or Firm* — Birch, Stewart, Kolasch & Birch, LLP

(57) ABSTRACT

According to an aspect of the present invention, the first filters, which correspond to the two or more first colors that contribute to obtaining a brightness signal more than the second colors, are disposed within each pixel line in first direction to the fourth direction of the color filter arrangement, and it is configured so that the ratio of the number of pixels of the first colors corresponding to the first filters is larger than the ratio of the number of pixels of each color of the second colors corresponding to the second filters of two or more colors other than the first colors. Accordingly, the degree of reproducibility of the synchronization processing in a high-frequency wave area can be increased and the aliasing can be suppressed.

16 Claims, 22 Drawing Sheets

(56) References Cited

U.S. PATENT DOCUMENTS

| | | | |
|---|---|---|---|
| 2009/0066821 A1 | 3/2009 | Achong et al. | |
| 2010/0265352 A1 | 10/2010 | Nashizawa | |
| 2010/0302423 A1 | 12/2010 | Adams, Jr. et al. | |
| 2011/0019041 A1 | 1/2011 | Ishiwata et al. | |
| 2012/0025060 A1 | 2/2012 | Iwata | |
| 2012/0327277 A1* | 12/2012 | Myhrvold | 348/279 |

FOREIGN PATENT DOCUMENTS

| | | | |
|---|---|---|---|
| JP | 2-210996 A | 8/1990 |
| JP | 08-023543 A | 1/1996 |
| JP | 11-285012 A | 10/1999 |
| JP | 2000-308080 A | 11/2000 |
| JP | 2004-266369 A | 9/2004 |
| JP | 2005-136766 A | 5/2005 |
| JP | 2007-184904 A | 7/2007 |
| JP | 2007-306490 A | 11/2007 |
| JP | 2008-236620 A | 10/2008 |
| JP | 2010-153511 A | 7/2010 |
| JP | 5054856 B1 | 10/2012 |
| WO | WO 2008/066698 A2 | 6/2008 |

OTHER PUBLICATIONS

ISR & Written Opinion in PCT/JP2012/080898 (English translation is attached).

ISR & Written Opinion in PCT/JP2012/080899 (English translation is attached).

ISR & Written Opinion in PCT/JP2012/081644 (English translation is attached).

ISR & Written Opinion in PCT/JP2012/083583 (English translation is attached).

European Search Report dated Jul. 30, 2014 for European Application No. 11860499.0.

Extended European Search Report dated Aug. 4, 2014, issued in European Patent Application No. 11859479.5.

Extended European Search Report dated Oct. 28, 2014, issued in European Patent Application No. 11859950.5.

Jim Adams et al.; Color Processing in Digital Cameras; vol. 18; No. 6; Nov. 1, 1998; pp. 20-30 (XP000805931).

Keigo Hirakawa et al.; Spatio-Spectral Color Filter Array Design for Optimal Image Recovery; IEEE Transactions on Image Processing; vol. 17; No. 10; Oct. 1, 2008; pp. 1876-1890.

Kenneth A. Parulski et al.; High-performance digital color video camera; Journal of Electronic Imaging; vol. 1; No. 1; Jan. 1, 1992; pp. 35-45.

Russian Office Action dated Oct. 15, 2014, issued in Russian Patent Application No. 2013138394.

Yan Li et al.; Color Filter Arrays: A design Methodology; University of London—Department of Computer Science; May 2008; pp. FP-21 (XP002730894).

* cited by examiner

12: COLOR IMAGING ELEMENT

VERTICAL DIRECTION (V)

HORIZONTAL DIRECTION (H)

A ARRANGEMENT    B ARRANGEMENT

VERTICAL DIRECTION (V)

HORIZONTAL DIRECTION(H)

COLOR IMAGING ELEMENT AND IMAGING APPARATUS

BACKGROUND OF THE INVENTION

1. Field of the Invention

The present invention relates to a color imaging element and an imaging apparatus, particularly to a color imaging element and an imaging apparatus capable of reducing generation of color moire and achieving high resolution.

2. Description of the Related Art

In a color imaging element of a single plate, since each pixel is provided with a unicolor color filter thereover, each pixel has only unicolor color information. Therefore, since the image which is output from the single-plate color imaging element is a RAW image (mosaic image), a multi-channel image is obtained by performing processing (synchronization processing) in which a missing color pixel is interpolated from a pixel in a surrounding area. In this case, there is a problem in a reproduction characteristic of a high-frequency image signal; i.e. compared to a monochrome imaging element, a color imaging element tends to cause an aliasing more easily in a taken image. Therefore, there is a critical problem to achieve a high resolution by increasing reproduction band while suppressing the occurrence of color moire (false color).

In a primary color Bayer arrangement, which is a color arrangement of color filters most widely used in a color imaging element of a single plate, since green (G) pixels are disposed checkerwise and pixels of red (R) and blue (B) are disposed line-sequentially, there is a problem of reproducibility degree when generating a high-frequency signal in an oblique direction for G-signal and in a horizontal direction and in a vertical direction for R-signal and B-signal.

When a monochrome vertically-striped pattern (high-frequency image) as shown in FIG. 23A enters a color imaging element which has color filters of Bayer arrangement as shown in FIG. 23B, the resultant images are as described below. That is, when the resultant images are compared for each color while sorting the images based on the color arrangement of the Bayer, R results in a thin flat image; B results in a dark flat image; and G results in a thin and dark mosaic color image as shown in FIGS. 23C to 23E, respectively. In the image, which is an originally monochrome image in which no concentration difference (level difference) occurs among R, G and B, the resultant image is colored depending on the color arrangement and the input frequency.

Likewise, when an image, which is a high-frequency oblique monochrome image as shown in FIG. 24A, enters an imaging element which has color filters of Bayer arrangement shown in FIG. 24B, the resultant images are as described below. That is, when the resultant images are compared for each color while sorting the images based on the color arrangement of the Bayer, R and B result in a thin flat color image; and G results in a dark flat color image as shown in FIGS. 24C to 24E. Assuming that the value of black is 0 and the value of white is 255, since only G is 255, the high-frequency monochrome oblique image results in a green image. As described above, the high-frequency oblique image cannot be correctly reproduced using the Bayer arrangement.

In an imaging apparatus which uses a color imaging element of a single plate, optical low-pass filter of a birefringent material such as a crystal is generally disposed in front of the color imaging element, thereby the problem is eliminated by optically reducing high-frequency waves. However, in this method, although the coloring due to a reflection of the high-frequency signal can be reduced, a problem is that the resolution is decreased accordingly.

In order to solve the above problems, there is proposed a color imaging element, in which a color filter arrangement of the color imaging element is configured in a three-color random array satisfying the following arrangement restriction conditions. That is, an arbitrary given pixel abuts on any one of three color pixels including a color of the given pixel at any one of four sides of the given pixel (Japanese Patent Application Laid-Open No. 2000-308080).

Also, there is proposed an image sensor (color imaging element), in which a color filter arrangement includes a plurality of filters each having different spectral sensitivity; and a first filter and a second filter are alternately disposed at a first predetermined cycle in one diagonal direction of a grid of pixel of the image sensor and alternately disposed at a second predetermined cycle in the other diagonal direction (Japanese Patent Application Laid-Open No. 2005-136766).

Further, there is proposed a color arrangement in color solid-state imaging elements (color imaging elements) of three primary colors of R, G and B, which is configured so that a set of 3 pixels of R, G and B are disposed flatly in a zigzag manner in a vertical direction to thereby uniform the appearance frequency of R, G and B; and an arbitrary line on an imaging area (flat line, vertical line and oblique line) passes through every color (Japanese Patent Application Laid-Open No. 11-285012).

Furthermore, there is proposed a color imaging element, in which R and B in three primary colors of R, G and B are disposed at intervals of 3 pixels in a horizontal direction and in a vertical direction; and G is disposed between the R and B (Japanese Patent Application Laid-Open No. 8-23543).

SUMMARY OF THE INVENTION

The color imaging element set forth in Japanese Patent Application Laid-Open No. 2000-308080 has the following problem. That is, since the filter arrangements are random, an optimization has to be performed for each random pattern when the subsequent synchronization processing (also referred to as demosaicing; hereinafter the same applies) is performed, resulting in the complicated synchronization processing. Also, although the random array is effective against low-frequency color moire, but the same is not effective to the false color in a high-frequency area.

The color imaging element set forth in Japanese Patent Application Laid-Open No. 2005-136766 has the following problem. That is, since G pixels (brightness pixels) are disposed checkerwise (checker flag-like), the pixel degree of reproducibility is hardly obtained satisfactorily in a resolution limit area (in particular, in an oblique direction).

The color imaging element set forth in Japanese Patent Application Laid-Open No. 11-285012 has an advantage that, since filters for every color are provided on an arbitrary line, the occurrence of the false color can be suppressed. However, since the ratios of the number of pixels of R, G and B are identical to each other, compared to the Bayer arrangement, a problem is that the high-frequency wave reproducibility is reduced. In the Bayer arrangement, the ratio of the number of G pixels, which most contributes to obtaining a brightness signal, is two times the number of pixels of R and B.

In the color imaging element set forth in Japanese Patent Application Laid-Open No. 8-23543, since the ratio of the number of G pixels with respect to the number of pixels of R and B is, compared to the Bayer arrangement, extremely high, the color reproducibility is reduced.

The present invention has been made in view of the above problems. An object of the present invention is to provide a color imaging element capable of suppressing the occurrence of false color, achieving high resolution and, compared to conventional random arrays, simplifying the subsequent processing. Another object of the present invention is to provide an imaging apparatus capable of suppressing the occurrence of false color, achieving high resolution and, compared to conventional random arrays, simplifying the subsequent processing.

To achieve the above object, an aspect of the present invention is a color imaging element of a single plate, which includes: color filters disposed over a plurality of pixels each including a photoelectric conversion element arranged in a first direction and a second direction perpendicular to the first direction, wherein an arrangement of the color filters has first filters corresponding to two or more first colors and second filters corresponding to two or more second colors, the second colors have a lower contribution ratio for obtaining a brightness signal than that of the first colors, the arrangement of the color filters includes a basic arrangement pattern in which the first filters and the second filters are arranged, the basic arrangement pattern is repeatedly disposed in the first direction and the second direction, one or more of the first filters are disposed within each pixel line of the arrangement of the color filters in the first direction and the second direction and in a third direction and a fourth direction that are inclined with respect to the first direction and the second direction, one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

Another aspect of the present invention is a color imaging element of a single plate, which includes: color filters disposed over a plurality of pixels each including a photoelectric conversion element arranged in a first direction and a second direction perpendicular to the first direction, wherein an arrangement of the color filters has first filters corresponding to two or more first colors, a transmissivity peak of which is within a wavelength range of 480 nm or more and 570 nm or less, and second filters corresponding to two or more second colors a transmissivity peak of which is out of the range, and includes a basic arrangement pattern in which the first filters and the second filters are arranged, the basic arrangement pattern is repeatedly disposed in the first direction and the second direction, one or more of the first filters are disposed within each pixel line of the arrangement of the color filters in the first direction and the second direction and in a third direction and a fourth direction that are inclined with respect to the first direction and the second direction, one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

Yet another aspect of the present invention is a color imaging element of a single plate, which includes: color filters disposed over a plurality of pixels each including a photoelectric conversion element arranged in a first direction and a second direction perpendicular to the first direction, wherein an arrangement of the color filters has first filters corresponding to two or more first colors and second filters corresponding to two or more second colors, a transmissivity of which is lower than a transmissivity of the first filters within a wavelength range of 500 nm or more and 560 nm or less, and includes a basic arrangement pattern in which the first filters and the second filters are arranged, the basic arrangement pattern is repeatedly disposed in the first direction and the second direction, one or more of the first filters are disposed within each pixel line of the arrangement of the color filters in the first direction and the second direction and in a third direction and a fourth direction that are inclined with respect to the first direction and the second direction, one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

Yet another aspect of the present invention is a color imaging element of a single plate, which includes: color filters disposed over a plurality of pixels each including a photoelectric conversion element arranged in a first direction and a second direction perpendicular to the first direction, wherein an arrangement of the color filters has first filters corresponding to two or more first colors, which includes a color that most contributes to a brightness signal in three primary colors and a fourth color different from the three primary colors, and second filters corresponding to two or more second colors other than the first colors, and includes a basic arrangement pattern in which the first filters and the second filters are arranged, the basic arrangement pattern is repeatedly disposed in the first direction and the second direction, one or more of the first filters are disposed within each pixel line of the arrangement of the color filters in the first direction and the second direction and in a third direction and a fourth direction that are inclined with respect to the first direction and the second direction, one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

According to the above aspects, since one or more of the first filters are disposed with one or more pixels within the pixel lines in each direction from the first direction to the fourth direction of the arrangement of the color filters, the degree of reproducibility of the synchronization processing can be increased in the high-frequency wave area. In the second filters corresponding to the second colors of two or more colors other than the first colors also, since one or more of the second filters are disposed within each pixel line in the first and second directions on the arrangement of the color filters, the occurrence of color moire (false color) is suppressed resulting in a high resolution.

Also, in the color filter arrangement, since the predetermined basic arrangement pattern is repeatedly disposed in the first and second directions, the processing can be performed in accordance the repeated pattern when the subsequent synchronization processing is performed. Compared to the conventional random array, the subsequent processing can be simplified.

Moreover, it is configured so that the ratio is different from each other between the number of pixels of the first colors of two or more colors corresponding to the first filters and the number of pixels of each color of the second colors corresponding to the second filters, and the ratio of the number of pixels of the first colors corresponding to the first filters is larger than the ratio of the number of pixels each color of the second colors corresponding to the second filters, thus the aliasing can be suppressed and a high-frequency wave reproducibility can be obtained.

In the color imaging element according to yet another aspect of the present invention, the contribution ratio of the first colors for obtaining a brightness signal is 50% or more, and the contribution ratio of the second colors for obtaining the brightness signal is less than 50%.

In the color imaging element according to yet another aspect of the present invention, the color filter arrangement preferably includes a portion where the first filters continue for 2 pixels or more within each pixel line in the first direction, the second direction, the third direction and the fourth direction. With this, the direction in which the change of brightness is smallest between the pixels at minimum distance in the first to fourth directions (direction in which the correlation is high) can be determined.

In the color imaging element according to yet another aspect of the present invention, the arrangement of the color filters preferably includes 2×2 pixels of the first filters as the pixels in the first direction and the second direction. By using the pixel values of the 2×2 pixels, the direction in which the correlation is highest in the first direction to the fourth direction can be determined.

In the color imaging element according to yet another aspect of the present invention, the arrangement of the color filters within the basic arrangement pattern is preferably point symmetric with respect to the center of the basic arrangement pattern. With this, the circuit size of the subsequent processing circuit can be reduced.

In the color imaging element according to yet another aspect of the present invention, the basic arrangement pattern is preferably an arrangement pattern in which the pixels in the first direction and the second direction correspond to N×N (N: an integer of 4 or more and 8 or less) pixels. The reason for this is: when N is smaller than 4, the conditions of the arrangement of the color filters according to the present invention are not satisfied. When N is larger than 8, the signal processing of the synchronization or the like gets complicated. Any particular effect by increasing the size of the basic arrangement pattern cannot be obtained.

In the color imaging element according to yet another aspect of the present invention, the basic arrangement pattern is preferably an arrangement pattern in which the pixels in the first direction and the second direction correspond to 6×6 pixels.

As described above, the basic arrangement pattern is an arrangement pattern corresponding to N×N pixels. N is preferably an integer of 4 or more and 8 or less. As for N, an even number is advantageous than an odd number for the synchronization processing. When N is 4, no portion where the first filters continue for 2 pixels or more within each pixel line in the first direction to the fourth direction is included within the basic arrangement pattern. This is disadvantageous for determination of the direction where the change of brightness is small. In the case when N is 8, compared to the case when N is 6, the signal processing gets complicated. Therefore, as the basic arrangement pattern, N is 6; i.e. the arrangement pattern corresponding to 6×6 pixels is most preferable.

In the color imaging element according to yet another aspect of the present invention, in the arrangement of the color filters, the first filters are preferably disposed at the center and the four corners in a 3×3 pixel group, and the 3×3 pixel group is repeatedly disposed in the first direction and the second direction. Since the first filters are disposed at the four corners of the 3×3 pixel group, when the 3×3 pixel group is repeatedly disposed in the first direction and the second direction, the color filter arrangement includes the arrangement corresponding to 2×2 pixels of the first filters. The direction where the correlation is high in the first direction to the fourth direction can be determined by using the pixel value of the 2×2 pixels, and the first filters are disposed within each pixel line in the first direction to the fourth direction of the color filter arrangement.

In the color imaging element according to yet another aspect of the present invention, the first filters corresponding to any one color of the first colors are disposed at the center of the 3×3 pixel group, and the first filters corresponding to the other color of the first colors are disposed at the four corners of the 3×3 pixel group.

In the color imaging element according to yet another aspect of the present invention, one or more of the second filters are preferably disposed within each pixel line of the arrangement of the color filters in the first direction, the second direction, the third direction and the fourth direction. With this, the color reproducibility in the oblique direction can be increased.

In the color imaging element according to yet another aspect of the present invention, the first colors include two or more colors of a first green (G), a second G having a wavelength band different from that of the first G and white (W), and the second colors include colors of red (R) and blue (B).

In the color imaging element according to yet another aspect of the present invention, the basic arrangement pattern is an arrangement pattern in which the pixels in the first direction and the second direction correspond to 6×6 pixels, and the arrangement of the color filters is preferably configured by a first arrangement corresponding to the 3×3 pixels and a second arrangement corresponding to the 3×3 pixels being alternately arranged in the first direction and the second direction, wherein in the first arrangement, the first filters corresponding to the first G, the second G or W are disposed at the center and the four corners, and the second filters corresponding to B are disposed in the first direction and the second filters corresponding to R are arranged in the second direction with the first filters at the center interposed therebetween, and wherein in the second arrangement, the first filters corresponding to the first G, the second G or W are disposed at the center and the four corners, and the second filters corresponding to R are disposed in the first direction and the second filters corresponding to B are arranged in the second direction with the first filters at the center interposed therebetween.

The basic arrangement pattern includes the first filters of the arrangement corresponding to the 2×2 pixels, and is the basic arrangement pattern of the minimum size that is point symmetric with respect to the center of the basic arrangement pattern. Further, according to the color filter arrangement of the above-described configuration, when 5×5 pixels (local region of mosaic image) with the first arrangement or the second arrangement at the center are extracted, the 2×2 pixels of the first color are located at the four corners of the 5×5 pixels. The pixel value of the 2×2 pixels of the first color can be used for determination of the correlated direction in the four directions.

According to the present invention, the first filters, which correspond to the two or more first colors that contribute to obtaining a brightness signal more than the second colors, are disposed within each pixel line in first direction to the fourth direction of the color filter arrangement, and it is configured so that the ratio of the number of pixels of the first colors corresponding to the first filters is larger than the ratio of the number of pixels of each color of the second colors corresponding to the second filters of two or more colors other than the first colors. Accordingly, the degree of reproducibility of the synchronization processing in a high-frequency wave area can be increased and the aliasing can be suppressed.

Also, one or more of the second filters, which correspond to the second color of two or more colors other than the first colors, are disposed within each pixel line in the first direction and the second direction of the color filter arrangement within the basic arrangement pattern. Accordingly, the occurrence of color moire (false color) can be suppressed and thus, a high resolution can be achieved.

Moreover, in the color filter arrangement according to the present invention, the basic arrangement pattern is repeated in the first direction and the second direction. Accordingly, when the subsequent synchronization processing is performed, the processing can be performed according to the repeated pattern. Compared to the conventional random array, the subsequent processing can be simplified.

To achieve the above object, an aspect of the present invention is an imaging apparatus, including: an imaging optical system; a color imaging element on which an image of an object is formed by the imaging optical system; an image data generating device which generates image data indicating the formed image of the object, wherein the color imaging element is the color imaging element according to any one of the above aspects of the present invention. According to the imaging apparatus of the present invention, since the imaging element is the imaging element according to any one of the above aspects of the present invention, it is possible to suppress the occurrence of false color and achieve high resolution, and thus it is possible to simplify the subsequent processing compared to conventional random arrays.

BRIEF DESCRIPTION OF THE DRAWINGS

FIG. 7 illustrates a color filter arrangement according to a second embodiment;

FIG. 8 illustrates a color filter arrangement according to a third embodiment;

FIG. 10 illustrates a color filter arrangement according to a fifth embodiment;

FIG. 11 illustrates a color filter arrangement according to a sixth embodiment;

FIG. 13 illustrates a color filter arrangement according to an eighth embodiment;

FIG. 14 illustrates a color filter arrangement according to a ninth embodiment;

FIG. 15 illustrates a color filter arrangement according to a tenth embodiment;

DETAILED DESCRIPTION OF THE PREFERRED EMBODIMENTS

[Entire Configuration of Digital Camera]

Figure 1:
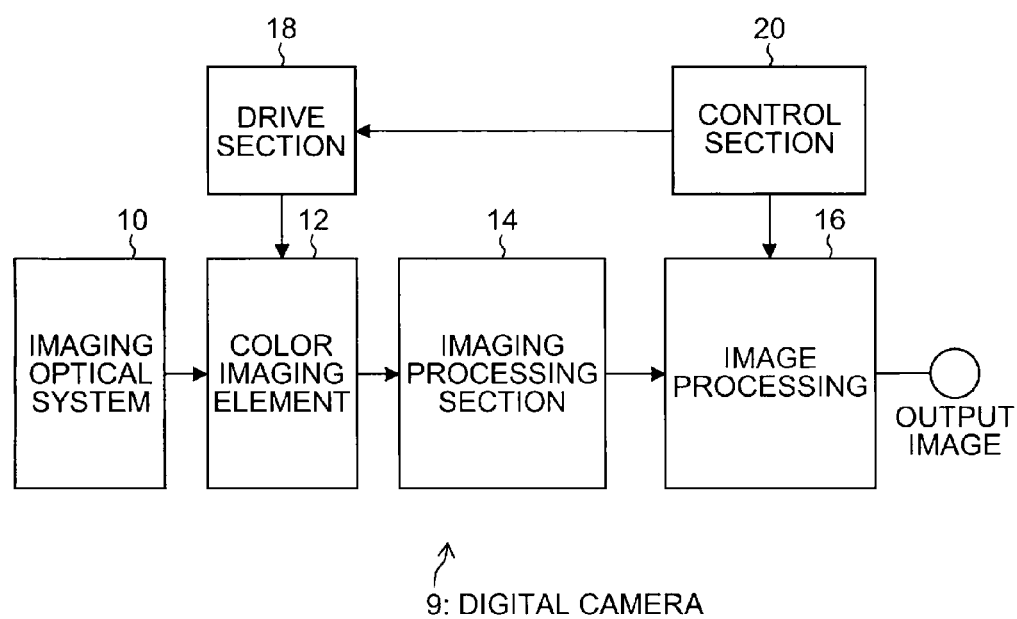
FIG. 1 is a block diagram illustrating an electrical configuration of a digital camera.

FIG. 1 is a block diagram of a digital camera 9 that includes a color imaging element according to the present invention. The digital camera 9 generally includes an imaging optical system 10, a color imaging element 12, an imaging processing section 14, an image processing section 16, a drive section 18, a control section 20 and the like.

The imaging optical system 10 forms an image of an object on an imaging area of the color imaging element 12. The color imaging element 12 is a so-called color imaging element of a single plate that includes a plurality of pixels configured by photoelectric conversion elements two-dimensionally arranged over an imaging area thereof, and a color filter provided above an acceptance surface of each pixel. The wording "over" and "above" here means a direction in which the light comes from an object with respect to the imaging area of the color imaging element 12.

The object image formed by the color imaging element 12 is converted into a signal charge corresponding to the volume of incident ray by a photoelectric conversion element of each pixel. The signal charge accumulated in each photoelectric conversion element is read in order from the color imaging element 12 as a voltage signal (image signal) corresponding to the signal charge based on a read command signal given by the drive section 18 in accordance with a command from the control section 20. The image signal read from the color imaging element 12 is a signal that represents a color mosaic image corresponding to a color filter arrangement of the color imaging element 12. The color imaging element 12 may be an imaging element of another kind such as a CCD (Charge Coupled Device) type imaging element or a CMOS (Complementary Metal Oxide Semiconductor) type imaging element.

The image signal read from the color imaging element 12 is input into the imaging processing section 14. The imaging processing section 14 has a correlated double sampling circuit (CDS) for removing reset noises included in the image signal, an AGC circuit for amplifying the image signal to control the same to a magnitude of a constant level, and an A/D converter. The imaging processing section 14 performs a correlated double sampling processing on the input image signal, and after amplifying the same, outputs RAW data that includes the converted digital image signal to the image processing section 16. When the color imaging element 12 is a CMOS type imaging element, the digital image signal is read directly from the color imaging element 12 and output to the image processing section 16.

The image processing section 16 has a white balance corrector circuit, a gamma corrector circuit, a synchronization processing circuit (a processing circuit that calculates (converts into a synchronization formula) every piece of color information of R, G and B from a mosaic image of R, G and B associated with the color filter arrangement of the color imaging element 12 of a single plate for each pixel), a brightness/color-difference signal forming circuit, an outline corrector circuit, a color corrector circuit and the like. The image processing section 16 performs a required signal processing on RAW data of a mosaic image that is input from the imaging processing section 14 in accordance with a command from the control section 20 to generate pixel signals of R, G and B for each pixel having color information of all of R, G and B; and based on the pixel signals, generates image data (YUV data) that includes brightness data (Y-data) and color-difference data (Cr and Cb data).

The image data generated by the image processing section 16 is subjected to a compression processing on a still image from a compaction/expansion circuit conforming to the JPEG standard, and a compression processing on a moving image conforming to the MPEG 2 standard; and the data is recorded in a recording medium (not shown) (for example, a memory card) or output to a display unit (not shown) such as a liquid crystal monitor to display the image thereon.

[Color Imaging Element]

Figure 2:
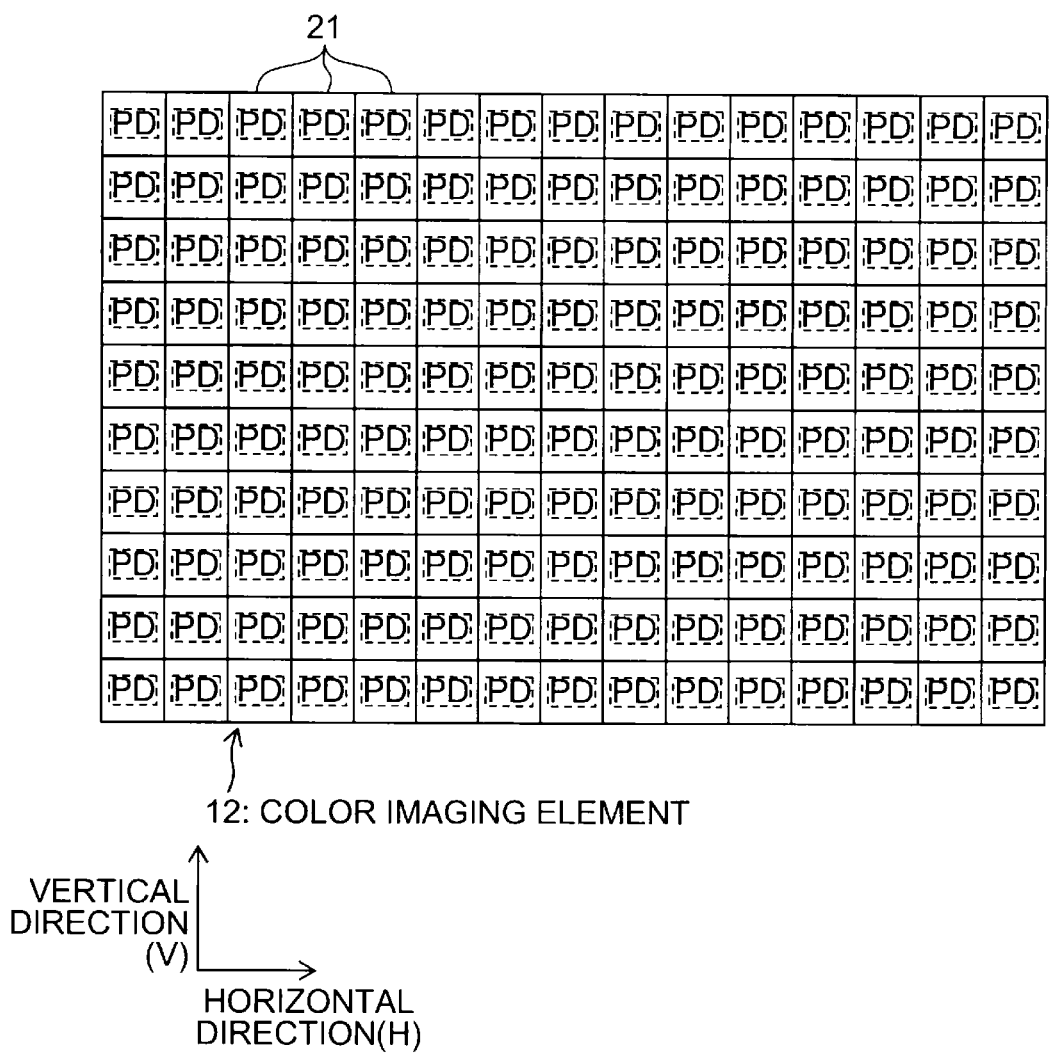
FIG. 2 is a front view of an imaging area of a color imaging element.

As shown in FIG. 2, the color imaging element 12 is provided with a plurality of pixels 21 each of which is configured by a photoelectric conversion element PD. The pixels 21 are two-dimensionally arranged in a horizontal direction and a vertical direction on the imaging area of the color imaging element 12. The wording "horizontal direction" here is equivalent to one direction of a first direction and a second direction in the present invention; and the wording "vertical direction" here is equivalent to the other direction of the first direction and the second direction in the present invention.

Figure 3:
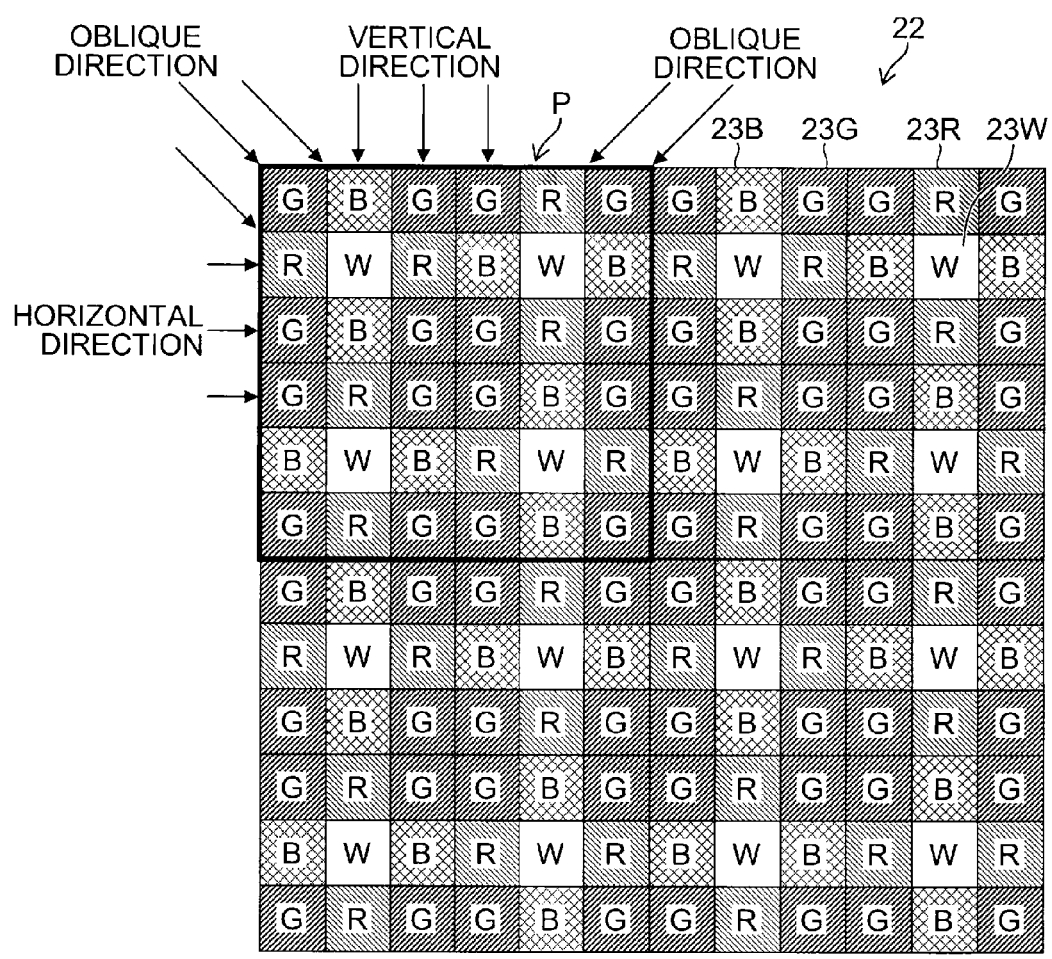
FIG. 3 illustrates a color filter arrangement according to a first embodiment.

FIG. 3 illustrates a color filter arrangement according to a first embodiment of the color filters disposed on the color imaging element 12.

The color imaging element 12 is provided with a color filter arrangement 22 on the imaging area; and the color filter arrangement 22 is configured by color filters each of which is disposed over each pixel 21 as shown in FIG. 3. The color filter arrangement 22 includes color filters of 23R, 23G and 23B of three primary colors: i.e. red (R), green (G) and blue (B) (hereinafter, referred to as R-filter, G-filter and B-filter, respectively) and a white (W) transparent filter 23W (hereinafter, referred to as "W-filter"). Any one of the R-, G-, B- and W-filters 23R, 23G, 23B and 23W is disposed over each pixel 21. Hereinafter, a pixel disposed with the R-filter 23R will be referred to as "R pixel;" a pixel disposed with the G-filter 23G will be referred to as "G pixel;" a pixel disposed with the B-filter 23B will be referred to as "B pixel;" and a pixel disposed with the W-filter 23W will be referred to as "W pixel."

The G color and the white color here are equivalent to a first color in the present invention; and the G-filter 23G and the W-filter 23W are equivalent to a first filter in the present invention. Also, R color and B color are equivalent to a second color in the present invention; and the R-filter 23R and the B-filter 23B are equivalent to a second filter in the present invention.

[First Embodiment of the Color Filter Arrangement]

A first embodiment of the color filter arrangement on the color imaging element shown in FIG. 3 has the following features (1) to (6).

[Feature (1)]

A color filter arrangement shown in FIG. 3 includes a basic arrangement pattern P (the pattern marked with a thick frame) which includes a tetragonal arrangement pattern corresponding to 6×6 pixels, and the basic arrangement pattern P is repeatedly disposed in the horizontal direction and the vertical direction. That is, in this color filter arrangement, color filters of R, G, B and W (R-filter, G-filter, B-filter and W-filter) are arranged at a predetermined cycle.

The R-filter, the G-filter, the B-filter and the W-filter are arranged at the predetermined cycle as described above. Therefore, when a synchronization (interpolation) processing or the like is performed on the R, G, B and W signals which are read from the color imaging element, the processing can be performed in accordance with the repeated pattern.

Also, when an image is contracted by performing a thinning-out process on the basic arrangement pattern P as a processing unit, the color filter arrangement of the contracted image after the thinning-out process can be identical to the color filter arrangement before the thinning-out process. Accordingly, the common processing circuit may be used.

[Feature (2)]

In the color filter arrangement shown in FIG. 3, the G-filter and the W-filter corresponding to the first colors (in this embodiment, colors of G and W) contribute to obtaining a brightness signal more than the second colors (in this embodiment, colors of R and B). At least one of the G-filter and the W-filter is disposed within each pixel line of the color filter arrangement in the horizontal direction, in the vertical direction, in an oblique upper-right direction, and in an oblique lower-right direction. The wording "pixel line" here means a line on which pixels are arranged in a line in the horizontal direction, the vertical direction, the oblique upper-right direction or the oblique upper-left direction, which hereinafter will be simply referred to as "line".

The oblique upper-right direction and the oblique upper-left direction are a direction each inclined by 45° in the horizontal direction and the vertical direction. The reason for this is: a plurality of pixels and color filters are arranged in a tetragonal grid state in the horizontal direction and the vertical direction. Therefore, when a plurality of pixels and color filters are arranged in a rectangular grid state, a direction of a diagonal line of the rectangular grid is the oblique upper-right direction or the oblique lower-right direction.

The oblique upper-right direction is equivalent to one direction of a third direction and a fourth direction in the present invention; and the oblique lower-right direction is equivalent to the other direction of the third direction and the fourth direction in the present invention.

At least one of the G-filter and the W-filter corresponding to the brightness-related pixels is disposed within each line of the color filter arrangement in the horizontal direction, the vertical direction, the oblique upper-right direction and the oblique lower-right direction. Therefore, the degree of reproducibility of the synchronization processing in a high-frequency wave area can be increased regardless of the direction of high-frequency wave. The wording "synchronization processing" here means a processing to calculate (to convert into synchronization formula) the color information on all of the R, G and B for each pixel from a mosaic image of R, G and B associated with the color filter arrangement of the color imaging element of a simple plate, which is also referred to as "demosaic processing" or "demosaicing processing".

[Feature (3)]

In the basic arrangement pattern of the color filter arrangement shown in FIG. 3, the R pixels, the G pixels, the B pixels and the W pixels corresponding to the R-, G-, B- and W-filters within the basic arrangement pattern and the numbers of the pixels are: 8 pixels, 16 pixels, 8 pixels and 4 pixels, respectively. Total number of brightness-related pixels (G and W pixels) is 20 pixels. That is, the ratio of the numbers of R, G+W and B pixels is 2:5:2. The ratio of the number of the brightness-related pixels (G and W pixels) that contribute to obtaining the brightness signal is larger than the ratio of the numbers of pixels of each color of other colors; i.e. R pixels and B pixels.

As described above, the ratio of the number of the brightness-related pixels (G and W pixels) and the ratio of the numbers of the R and B pixels are different from each other. Particularly, since it is configured so that the ratio of the number of the brightness-related pixels is larger than the ratio of the respective numbers of the R and B pixels, the aliasing during the synchronization processing can be suppressed and the high-frequency wave reproducibility can also be increased.

[Feature (4)]

In the color filter arrangement shown in FIG. 3, one or more R-filters and B-filters, which correspond to two or more second colors (in this embodiment, colors of R and B) other than the first colors (colors of G and W) as the brightness-related pixels, are disposed within each line of the color filter arrangement in the horizontal direction and the vertical direction within the basic arrangement pattern P.

Since the R-filter and the B-filter are disposed within each line of the color filter arrangement in the horizontal direction and the vertical direction, the occurrence of color moire (false color) can be suppressed. With this, no optical low-pass filter for suppressing the occurrence of false color has to be disposed in a light path from an entrance plane to the imaging area of the optical system; or even in the case when an optical low-pass filter is used, an optical low-pass filter, which has a weak function to cut high-frequency content to prevent the occurrence of false color, can be applied. Thus, the resolution can be ensured.

Figure 4:
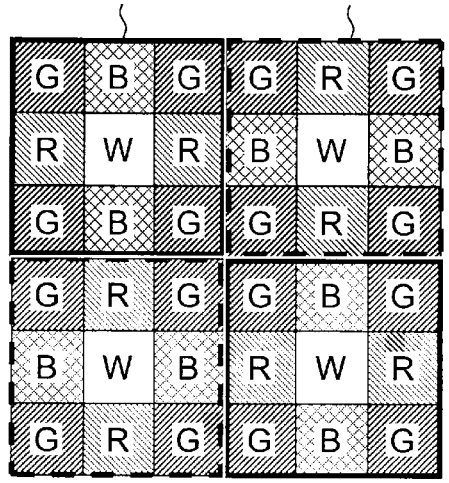
FIG. 4 illustrates a basic arrangement pattern in FIG. 3.

FIG. 4 illustrates a state in which the basic arrangement pattern P shown in FIG. 3 is divided into four 3×3 pixels.

The basic arrangement pattern P can be understood as described below. That is, an A arrangement including 3×3 pixels, which is enclosed by a frame of solid line, and a B arrangement including 3×3 pixels, which is enclosed by a frame of broken line, are alternately disposed in the horizontal direction and the vertical direction as shown in FIG. 4.

In the A arrangement and the B arrangement, G-filters each of which is the brightness-related pixel are disposed at four corners and a W-filter as another brightness-related pixel is disposed at the center. That is, in the A arrangement and the B arrangement, the G-filter and the W-filter, each of which is the brightness-related pixel, are disposed on the both diagonal lines of the 3×3 pixels. Also, in the A arrangement, the R-filters (R) are arranged in the horizontal direction and the B-filters are arranged in the vertical direction while the W-filter at the center is interposed therebetween. On the other hand, in the B arrangement, the B-filters are arranged in the horizontal direction and the R-filters are arranged in the vertical direction while the W-filter at the center is interposed therebetween. That is, in the A arrangement and the B arrangement, although the positional relationship between the R-filter and the B-filter is inverted, but the other arrangement is identical.

The A arrangement and the B arrangement are alternately disposed in the horizontal direction and the vertical direction as shown in FIG. 3. Therefore, the G-filters at the four corners in the A arrangement and the B arrangement form a tetragonal arrangement of G-filters corresponding to the 2×2 pixels.

The reason for this is as described below. That is, in the 3×3 pixels in the A arrangement and the B arrangement, the G-filter as the brightness-related pixel is disposed at the four corners, and the 3×3 pixels are alternately disposed in the horizontal direction and the vertical direction; thereby a tetragonal arrangement of the G-filters corresponding to the 2×2 pixels is formed.

[Feature (5)]

Figure 5:
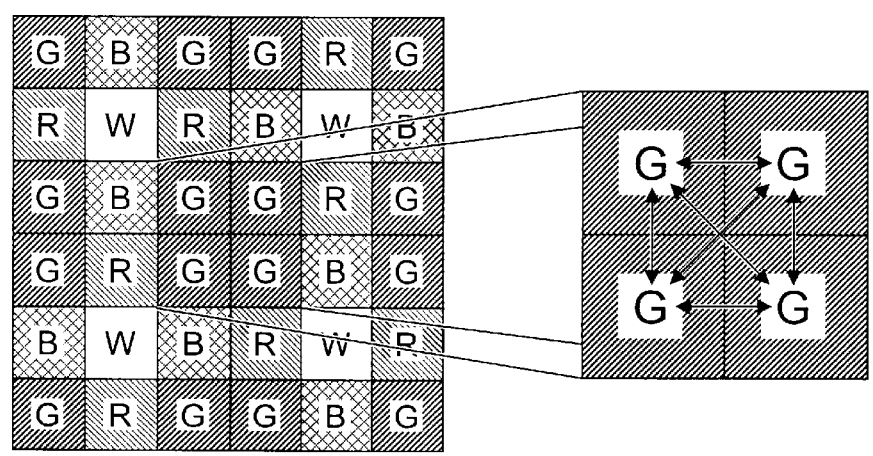
FIG. 5 is an illustration for describing a method to determine a correlated direction from a pixel value of a G pixel of 2×2 pixels included in the color filter arrangement of a color imaging element according to the first embodiment.

A color filter arrangement shown in FIG. 5 includes a tetragonal arrangement corresponding to 2×2 pixels of G-filters.

Selecting 2×2 pixels of the G-filters as shown in FIG. 5, an absolute value of difference between the pixel values of the G pixels is calculated in the horizontal direction, in the vertical direction, and in the oblique directions (oblique upper-right and oblique upper-left); thereby, a correlation is determined in a direction that has the smallest absolute value of difference in the horizontal direction, the vertical direction and the oblique directions.

That is, according to this color filter arrangement, by using information on the two continuous G pixels located at the minimum distance, the direction that has the highest correlation in the horizontal direction, the vertical direction and the oblique directions can be determined. The wording "distance between pixels" here means a distance between the pixels (pitch) from the center point of a reference pixel to the center point of the abutting pixel. When a plurality of pixels are arranged in a tetragonal grid state, the distance between the pixels abutting on each other in the oblique direction is $\sqrt{2}/2$ times the distance between the pixels abutting on each other in the horizontal direction and the vertical direction.

The direction determination result using the information on the abutting G pixels can be used for a processing (synchronization processing) to perform interpolation from a pixel located in the surrounding area. In this case, for example, a direction determination processing section may be provided in the synchronization processing circuit to determine the direction by the direction determination processing section.

When an A arrangement or a B arrangement of 5×5 pixels (local region of the mosaic image) is extracted by selecting an A arrangement or a B arrangement of 3×3 pixels as a target of the synchronization processing as shown in FIG. 5, the G pixel of 2×2 pixels is located at the four corners of the 5×5 pixels. By using the pixel value of the G pixel of the 2×2 pixels, the correlated direction among the four directions can be precisely determined using the information on the G pixels located at minimum distance.

[Feature (6)]

The basic arrangement pattern P of the color filter arrangement shown in FIG. 3 is point symmetric with respect to the center of the basic arrangement pattern (center of the four G-filters). Also, the A arrangement and the B arrangement in the basic arrangement pattern are point symmetric with respect to a W-filter at the center as shown in FIG. 4.

With this symmetry, the circuit size in the subsequent processing circuits can be reduced or simplified.

Figure 6:
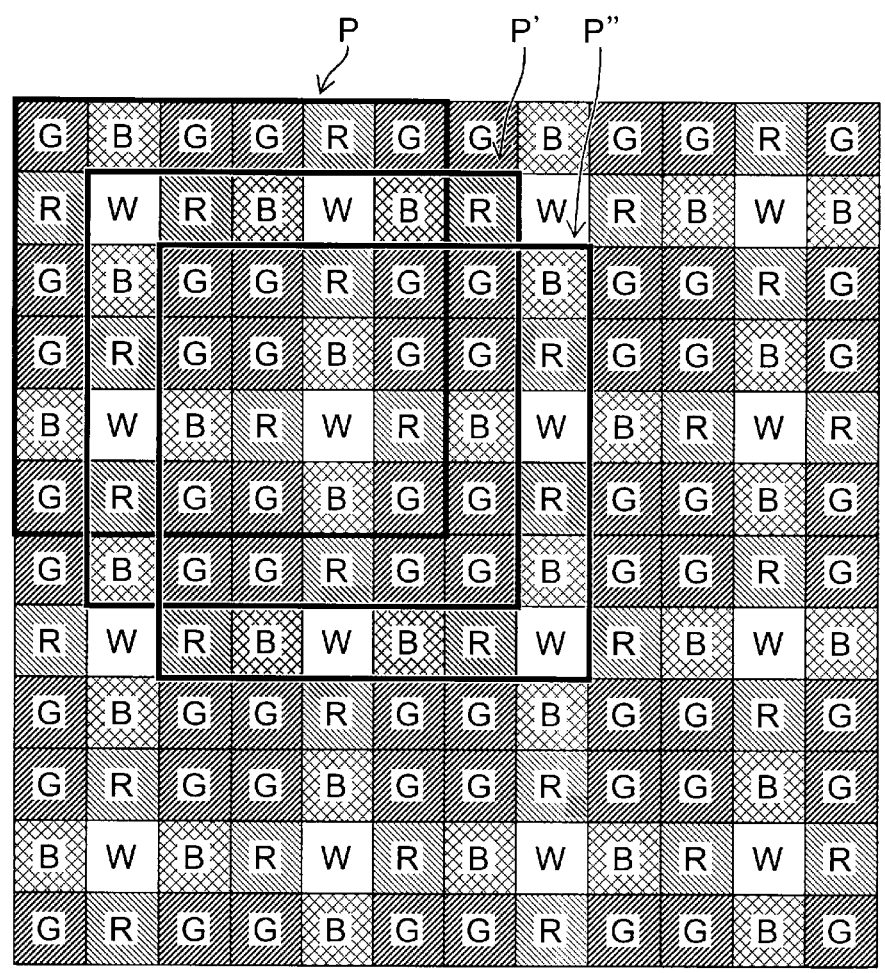
FIG. 6 is an illustration for describing a concept of the basic arrangement pattern included in the color filter arrangement of the color imaging element.

Assuming a basic arrangement pattern, in which the basic arrangement pattern P marked with a thick frame is shifted by one pixel in the horizontal direction and the vertical direction as P'; and the basic arrangement pattern, in which the basic arrangement pattern P is shifted by two pixels, as P''' as shown in FIG. 6, when the basic arrangement patterns P' and P''' are repeatedly disposed in the horizontal direction and the vertical direction, the same color filter arrangements are obtained.

That is, by repeatedly disposing the basic arrangement pattern in the horizontal direction and the vertical direction, a plurality of basic arrangement patterns that form a color filter arrangement shown in FIG. 6 exist. In the first embodiment, the basic arrangement pattern P, in which the basic arrangement pattern is point symmetric is referred to as the basic arrangement pattern for convenience.

Also, in the color filter arrangement according to another embodiment which will be described later, a plurality of basic arrangement patterns exist in each color filter arrangement. A typical color filter arrangement will be referred to as a basic arrangement pattern of the color filter arrangement.

[Second Embodiment of the Color Filter Arrangement]

Figure 7:
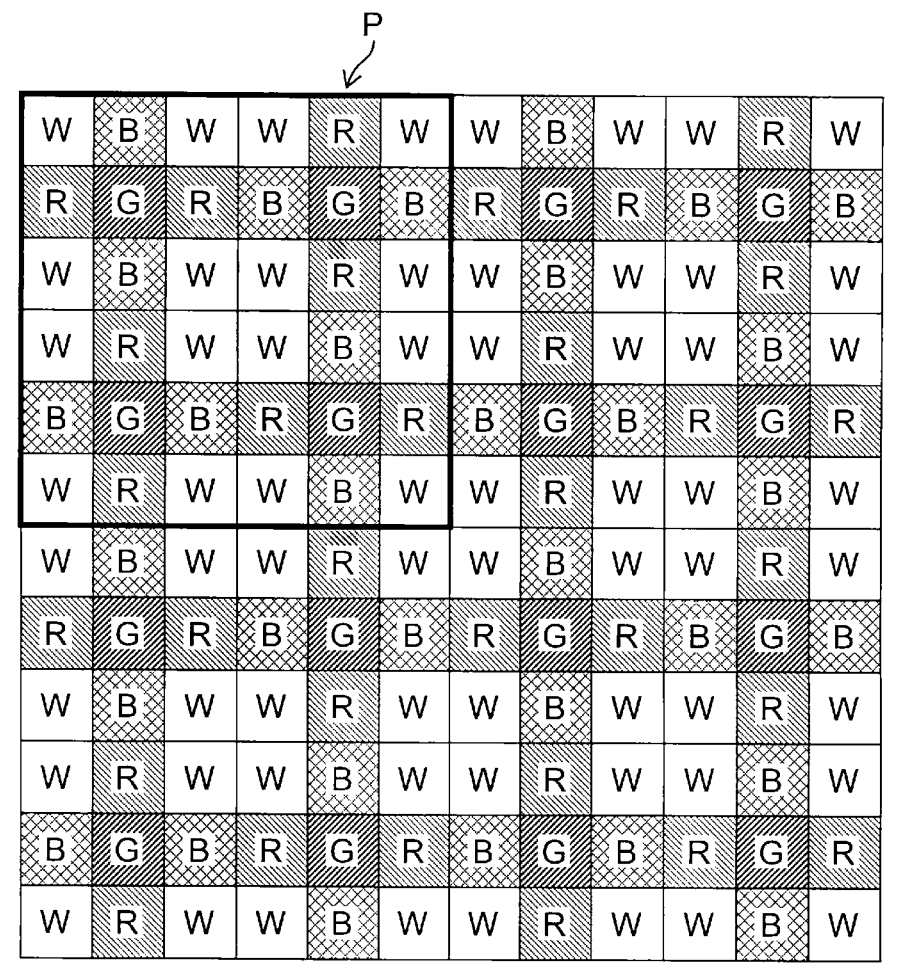

FIG. 7 illustrates a color filter arrangement according to a second embodiment.

The color filter arrangement according to the second embodiment is different from the color filter arrangement according to the first embodiment shown in FIG. 3 in a point that the disposed position of the G-filter and the W-filter is inverted each other.

The G-filter and the W-filter are the filters corresponding to the first colors (filter corresponding to brightness-related pixels). The color filter arrangement according to the second embodiment, in which the disposed position of the G-filter and the W-filter in the first embodiment is inverted each other, has the same features (1) to (6) as the color filter arrangement according to the first embodiment.

[Third Embodiment of the Color Imaging Element]

Figure 8:
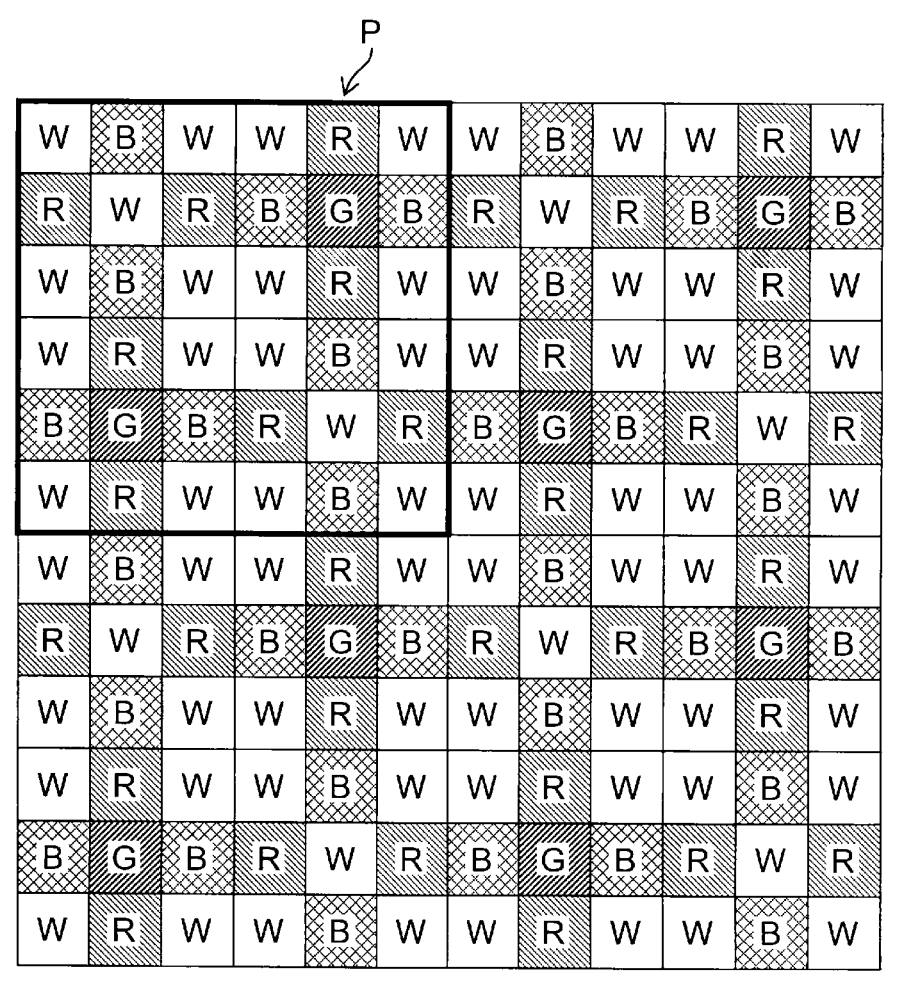

FIG. 8 illustrates a color filter arrangement according to a third embodiment.

The color filter arrangement of the color imaging element according to the third embodiment is a modification of the color filter arrangement according to the second embodiment shown in FIG. 7. The color filter arrangement according to the third embodiment is different from color filter arrangement according to the second embodiment in a point that the W-filters are disposed at the center of the A arrangement.

Accordingly, the color filter arrangement according to the third embodiment has the same features (1) to (6) as the color filter arrangement according to the first embodiment.

The color filter arrangement according to the third embodiment is different from the second embodiment in a point that the W-filters corresponding to the brightness-related pixels are disposed within each line of the color filter arrangement in the horizontal direction, the vertical direction, the oblique upper-right direction and the oblique lower-right direction (a point that the feature (2) is satisfied by the W-filter only).

As a modification of the color filter arrangement according to the third embodiment, the position of the G-filter and the W-filter may be inverted each other. In this case, the feature (2) is satisfied by the G-filter only.

[Fourth Embodiment of the Color Imaging Element]

Figure 9:
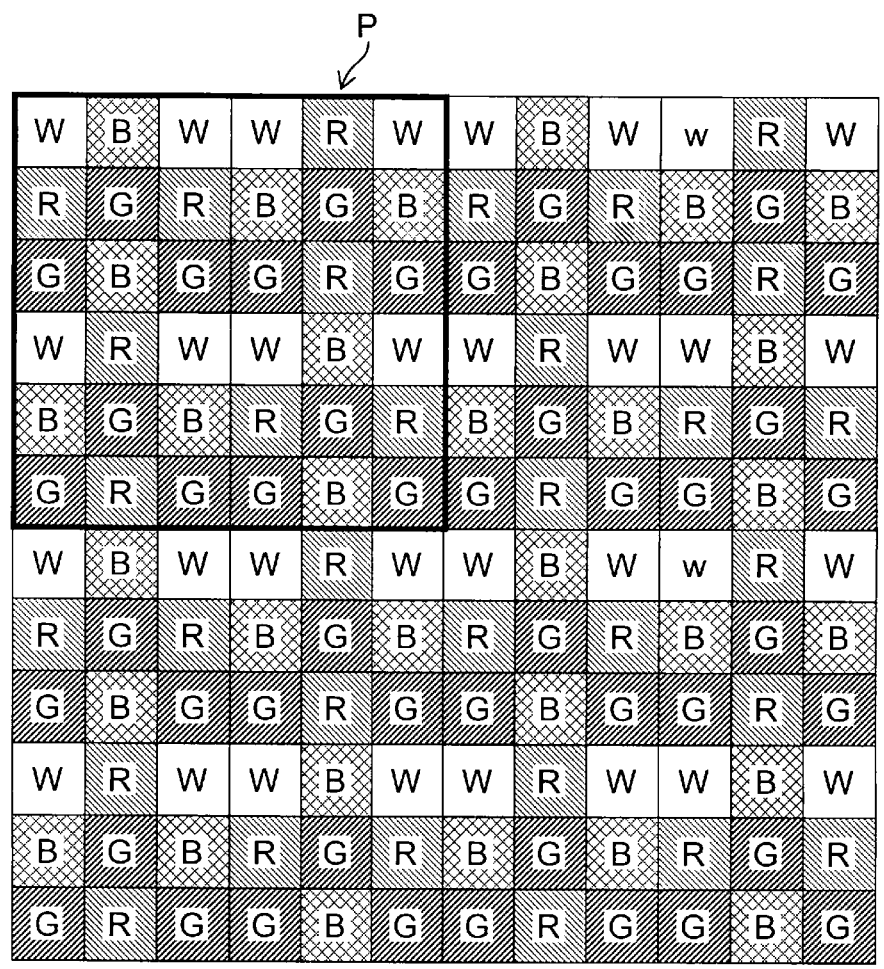
FIG. 9 illustrates a color filter arrangement according to a fourth embodiment.

FIG. 9 illustrates a color filter arrangement according to a fourth embodiment.

In the color filter arrangement of the color imaging element according to the fourth embodiment, compared to the second embodiment shown in FIG. 7, a part of the W-filters is replaced by the G-filter. The W-filters are disposed at the upper-left and the upper-right positions in the four corners of the 3×3 pixels in the A arrangement and the B arrangement. The G-filters are disposed at the lower-left and the lower-right positions in the four corners and at the center.

In the color filter arrangement according to the fourth embodiment, the brightness-related pixels of the identical color are not continuously disposed in the vertical direction. Therefore, the color filter arrangement according to the fourth embodiment has the features (1) to (4) excepting the feature (5) that the correlated direction among the 4 directions can be determined by using the information on the brightness-related pixels located at the minimum distance and the feature (6) that the basic arrangement pattern is point symmetric with respect to the center thereof.

As a modification of the color filter arrangement according to the fourth embodiment, the position of the G-filter and the W-filter may be inverted each other.

[Fifth Embodiment of the Color Imaging Element]

Figure 10:
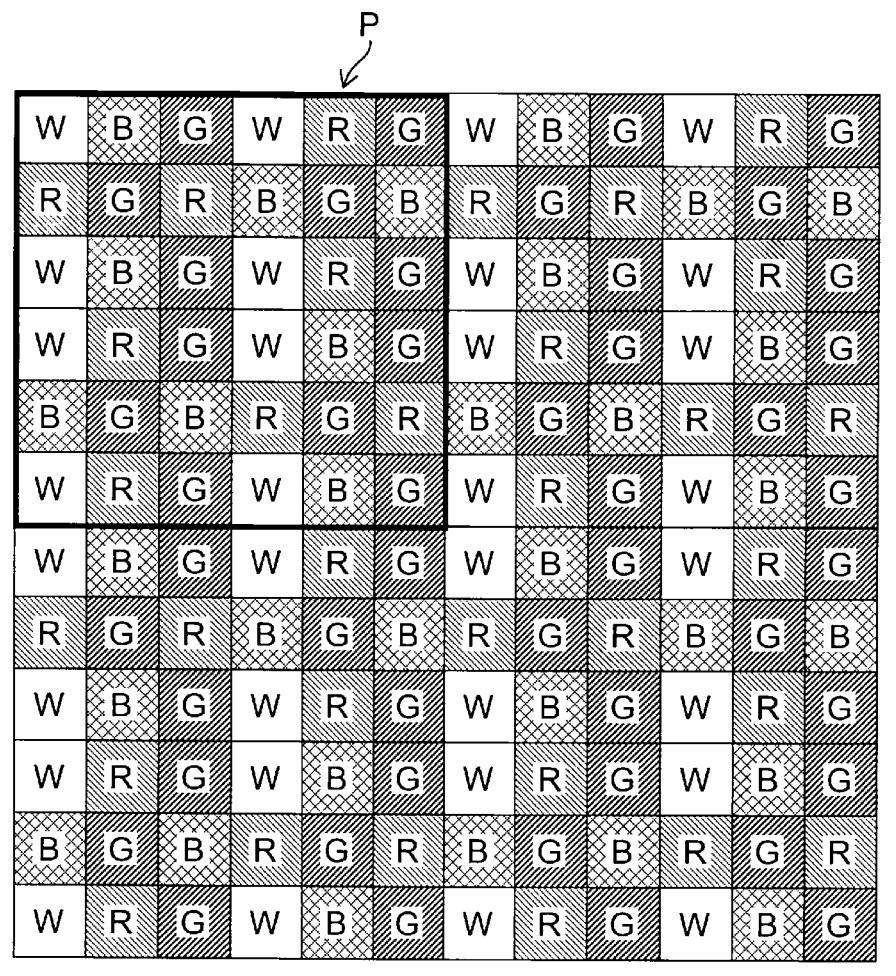

FIG. 10 illustrates a color filter arrangement according to a fifth embodiment.

In the color filter arrangement of the color imaging element according to the fifth embodiment, compared to the second embodiment shown in FIG. 7, a part of the W-filters is replaced by the G-filter. In the A arrangement and the B arrangement, the W-filters are disposed at the upper-left and lower-left positions in the four corners of the 3×3 pixels; and the G-filters are disposed at the upper-right and the lower-right positions in the four corners and at the center.

The color filter arrangement according to the fifth embodiment is equivalent to the color filter arrangement according to the fourth embodiment which is rotated by 90° in the counterclockwise direction.

The color filter arrangement according to the fifth embodiment has the same features (1) to (4) as the color filter arrangement according to the fourth embodiment.

As a modification of the color filter arrangement according to the fifth embodiment, the position of the G-filter and the W-filter may be inverted each other.

[Sixth Embodiment of the Color Imaging Element]

Figure 11:
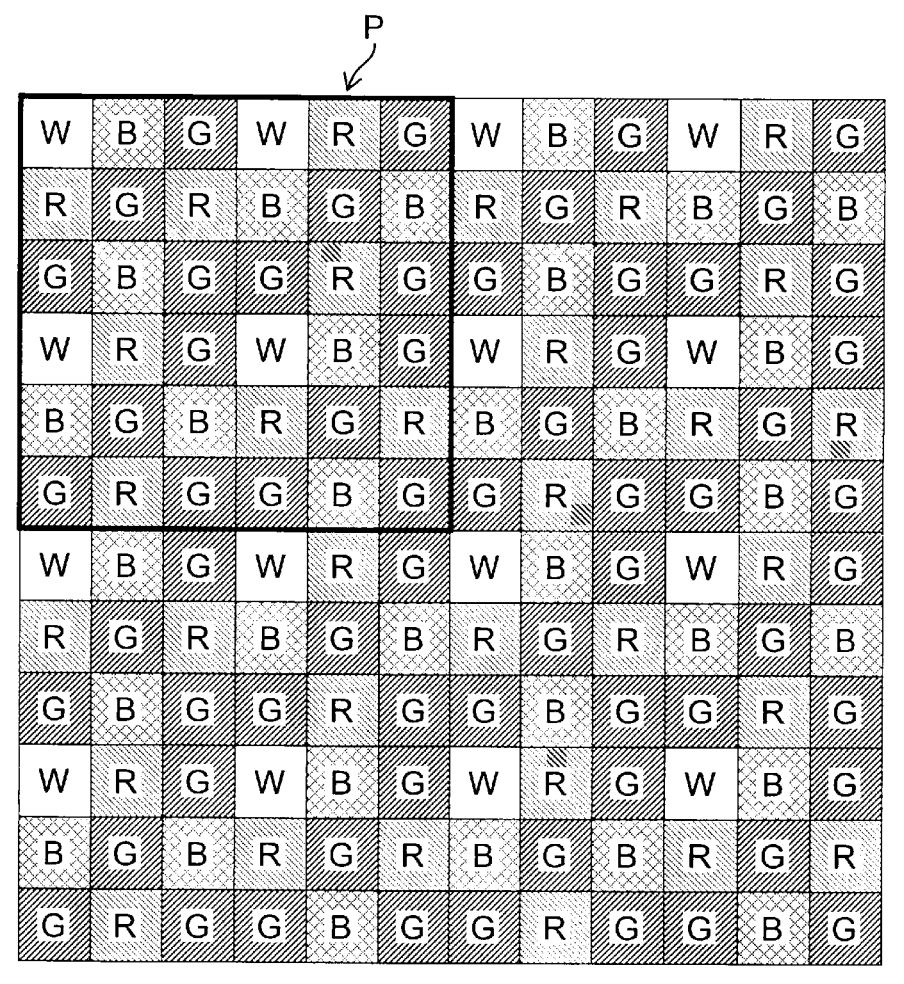

FIG. 11 illustrates a color filter arrangement according to the sixth embodiment.

In the color filter arrangement of the color imaging element according to the sixth embodiment, compared to the second embodiment shown in FIG. 7, a part of the W-filters is replaced by the G-filter. In the A arrangement and the B arrangement, the W-filter is disposed at the upper-left position in the four corners of the 3×3 pixels; and the G-filters are disposed at the lower-left, the upper-right and the lower-right positions in the four corners and at the center.

The color filter arrangement according to the sixth embodiment has the features (1) to (5) expecting the feature (6) that the basic arrangement pattern is point symmetric with respect to the center thereof.

As a modification of the color filter arrangement according to the sixth embodiment, the position of the G-filter and the W-filter may be inverted each other.

[Seventh Embodiment of the Color Imaging Element]

Figure 12:
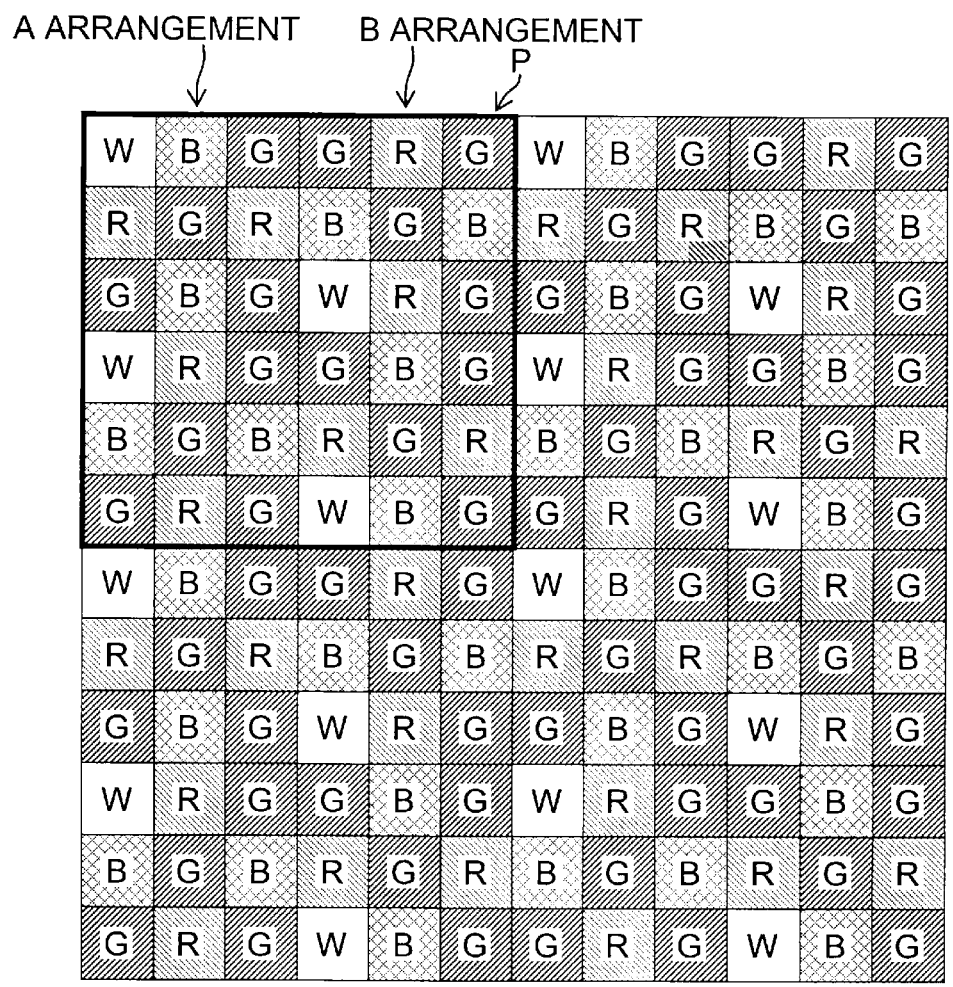
FIG. 12 illustrates a color filter arrangement according to a seventh embodiment.

FIG. 12 illustrates a color filter arrangement according to a seventh embodiment.

The color filter arrangement of the color imaging element according to the seventh embodiment is the same as the second embodiment shown in FIG. 7 in a point that only one W-filter is disposed in the A arrangement and the B arrangement; but the position of the W-filter is different in the B arrangement.

In the color filter arrangement according to the seventh embodiment, in the A arrangement, the W-filter is disposed at the upper-left position in the four corners of the 3×3 pixels; and the G-filter is disposed at the lower-left, the upper-right and the lower-right positions in the four corners and at the center. On the other hand, in the B arrangement, the W-filter is disposed at the lower-left position in the four corners of the 3×3 pixels; and the G-filter is disposed at the upper-left, the upper-right and the lower-right positions in the four corners and at the center.

The color filter arrangement according to the seventh embodiment has the features (1) to (5) excepting the feature (6) that the basic arrangement pattern is point symmetric with respect to the center thereof. Also, in the color filter arrangement according to the seventh embodiment, the feature (2) is satisfied by the G-filter only.

As a modification of the color filter arrangement according to the seventh embodiment, the position of the G-filter and the W-filter may be inverted each other. In this case, the feature (2) is satisfied by the W-filter only.

[Eighth Embodiment of the Color Imaging Element]

Figures 13, 14:
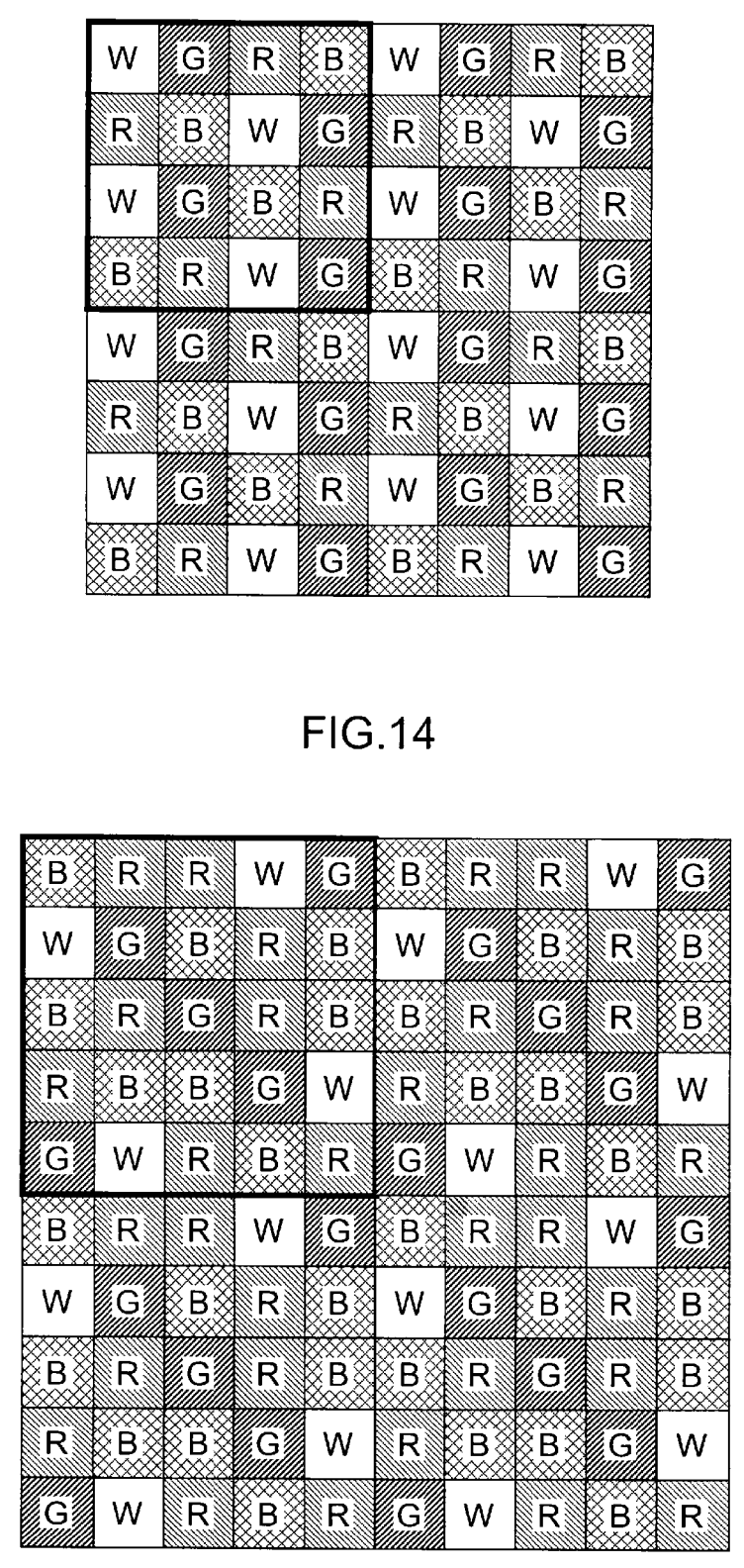

FIG. 13 illustrates a color filter arrangement according to an eighth embodiment.

The color filter arrangement of the color imaging element according to the eighth embodiment includes a basic arrangement pattern (the pattern marked with a thick frame) including a tetragonal arrangement pattern corresponding to the 4×4 pixels, and the basic arrangement pattern is repeatedly disposed in the horizontal direction and the vertical direction.

In the color filter arrangement, as in the first embodiment, at least one of the G-filter and the W-filter is disposed within each line of the color filter arrangement in the horizontal direction, the vertical direction, the oblique upper-right direction and the oblique lower-right direction; and within the basic arrangement pattern, the R-filter and the B-filter are disposed within each line of the color filter arrangement in the horizontal direction and the vertical direction.

In the color filter arrangement according to the eighth embodiment, 4 pixels of the R pixel, the G pixels, the B pixels and the W pixels corresponding to the R-, G-, B- and W-filters, respectively are disposed within the basic arrangement pattern. That is, the ratio of the numbers of R, G+W and B pixels is 1:2:1; the ratio of total number of brightness-related pixels (G pixels and W pixels) is larger than the ratio of the respective numbers of the R pixels and the B pixels.

As described above, the color filter arrangement of the color imaging element according to the eighth embodiment has the same features (1) to (4) as the color filter arrangement of the color imaging element according to the first embodiment.

In the color filter arrangement according to the eighth embodiment, the ratio of the number of pixels between the G-filters and the W-filters is 1:1. However, the ratio of the number of pixels between the G-filters and the W-filters is not limited thereto.

[Ninth Embodiment of the Color Imaging Element]

FIG. 14 illustrates a color filter arrangement according to a ninth embodiment.

The color filter arrangement of the color imaging element according to the ninth embodiment includes a basic arrangement pattern (the pattern marked with a thick frame) including a tetragonal arrangement pattern corresponding to the 5×5 pixels; the basic arrangement pattern is repeatedly disposed in the horizontal direction and the vertical direction.

In the color filter arrangement, at least one of the G-filter and the W-filter is disposed within each line of the color filter arrangement in the horizontal direction, the vertical direction, the oblique upper-right direction and the oblique lower-right direction as in the first embodiment; and within the basic arrangement pattern, one or more R-filters and B-filters are disposed within each line of the color filter arrangement in the horizontal direction and the vertical direction.

In the basic arrangement pattern of the color filter arrangement according to the ninth embodiment, the numbers of the R pixels, G pixels, B pixels and W pixels corresponding to the R-, G-, B- and W-filters within the basic arrangement pattern are 6 pixels, 9 pixels, 6 pixels and 4 pixels, respectively. That is, the ratio of the numbers of R, G+W and B pixels is 6:13:6. The ratio of total number of the brightness-related pixels (G pixels and W pixels) is larger than ratio of the respective numbers of the R pixels and the B pixels.

As described above, the color filter arrangement of the color imaging element according to the ninth embodiment has the same features (1) to (4) as the color filter arrangement according to the first embodiment.

In the color filter arrangement according to the ninth embodiment, the R-filters and the B-filters are disposed within each line of the color filter arrangement in the horizontal direction, the vertical direction, the oblique upper-right direction and the oblique lower-right direction. The color filter arrangement according to the ninth embodiment has a feature which is not found in the color filter arrangement according to the first embodiment.

[Tenth Embodiment of the Color Imaging Element]

Figure 15:
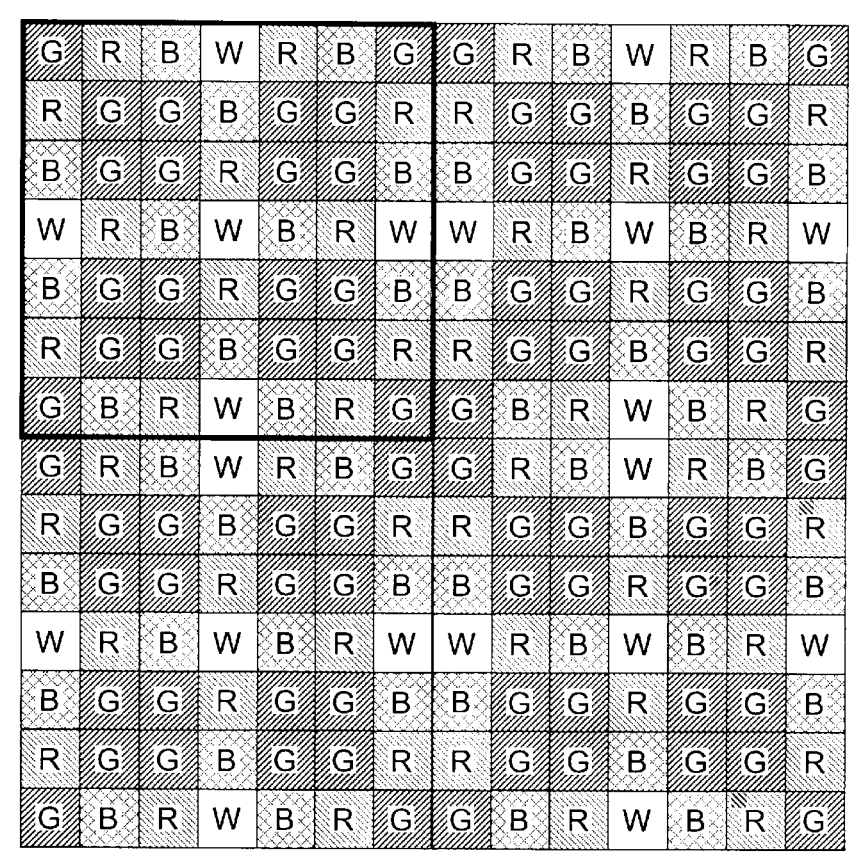

FIG. 15 illustrates a color filter arrangement according to the tenth embodiment.

The color filter arrangement of the color imaging element according to the tenth embodiment includes a basic arrangement pattern (the pattern marked with a thick frame) including a tetragonal arrangement pattern corresponding to the 7×7 pixels. The basic arrangement pattern is repeatedly disposed in the horizontal direction and the vertical direction.

As in the first embodiment, in the color filter arrangement, at least one of the G-filter and the W-filter is disposed within each line of the color filter arrangement in the horizontal direction, the vertical direction, the oblique upper-right direction and the oblique lower-right direction; and within the basic arrangement pattern, one or more R-filters and the B-filters are disposed within each line of the color filter arrangement in the horizontal direction and the vertical direction.

In the basic arrangement pattern of the color filter arrangement shown in FIG. 15, within the basic arrangement pattern, the numbers of R pixels, G pixels, B pixels and W pixels corresponding to the R-, G-, B- and W-filters are 12 pixels, 20 pixels, 12 pixels and 5 pixels, respectively. That is, the ratio of the numbers of the R, G+W and B pixels is 12:25:12. The ratio of total number of the brightness-related pixels (G pixels and W pixels) is larger than the ratio of the respective numbers of the R pixels and the B pixels.

The color filter arrangement includes a tetragonal arrangement corresponding to 2×2 pixels of the G-filters. The basic arrangement pattern is point symmetric with respect to the center of the basic arrangement pattern.

The color filter arrangement of the color imaging element according to the fifteenth embodiment has the same features (1) to (6) as the color filter arrangement of the color imaging element according to the first embodiment.

As a modification of the color filter arrangement according to the tenth embodiment, the position of the G-filter and the W-filter may be inverted each other.

[Eleventh Embodiment of the Color Imaging Element]

Figure 16:
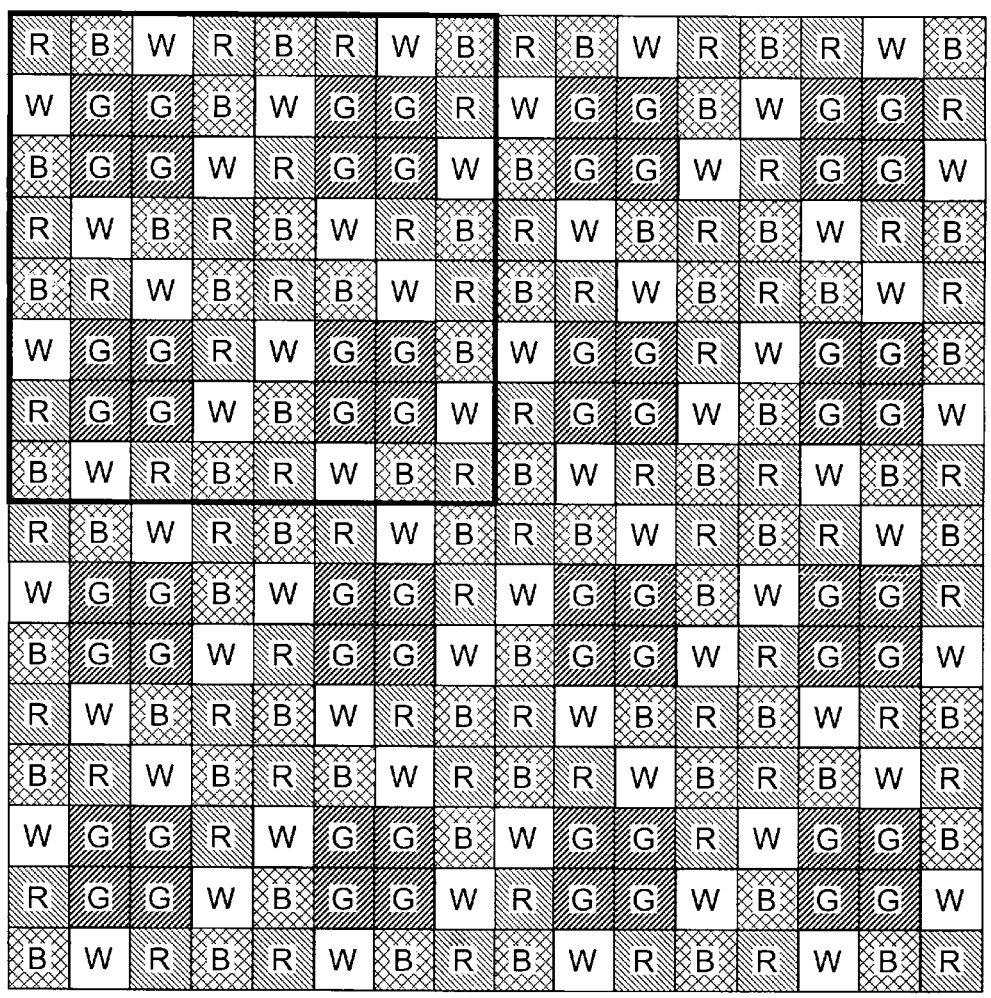
FIG. 16 illustrates a color filter arrangement according to an eleventh embodiment.

FIG. 16 illustrates a color filter arrangement according to an eleventh embodiment.

The color filter arrangement of the color imaging element according to the eleventh embodiment includes a basic arrangement pattern (the pattern marked with a thick frame) including a tetragonal arrangement pattern corresponding to the 8×8 pixels. The basic arrangement pattern is repeatedly disposed in the horizontal direction and the vertical direction.

As in the first embodiment, in the color filter arrangement, at least one of the G-filter and the W-filter is disposed within each line of the color filter arrangement in the horizontal direction, the vertical direction, the oblique upper-right direction and the oblique lower-right direction; and within the basic arrangement pattern, one or more R-filters and B-filters are disposed within each line of the color filter arrangement in the horizontal direction and the vertical direction.

In the basic arrangement pattern of the color filter arrangement shown in FIG. 16, within the basic arrangement pattern, the numbers of the R pixels, G pixels, B pixels and W pixels corresponding to the R-, G-, B- and W-filters are 16 pixels, 16 pixels, 16 pixels and 16 pixels, respectively. That is, the ratio of the numbers of the R, G+W and B pixels is 1:2:1. The ratio of the total number of the brightness-related pixels (G pixels and W pixels) is larger than the ratio of the respective numbers of the R pixels and the B pixels.

The color filter arrangement includes a tetragonal arrangement corresponding to the 2×2 pixels of the G-filters. The basic arrangement pattern is point symmetric with respect to the center of the basic arrangement pattern.

The color filter arrangement of the color imaging element according to the eleventh embodiment has the same features (1) to (6) as the color filter arrangement of the color imaging element according to the first embodiment.

As a modification of the color filter arrangement according to the eleventh embodiment, the position of the G-filter and the W-filter may be inverted each other.

[Twelfth Embodiment of the Color Imaging Element]

Figure 17:
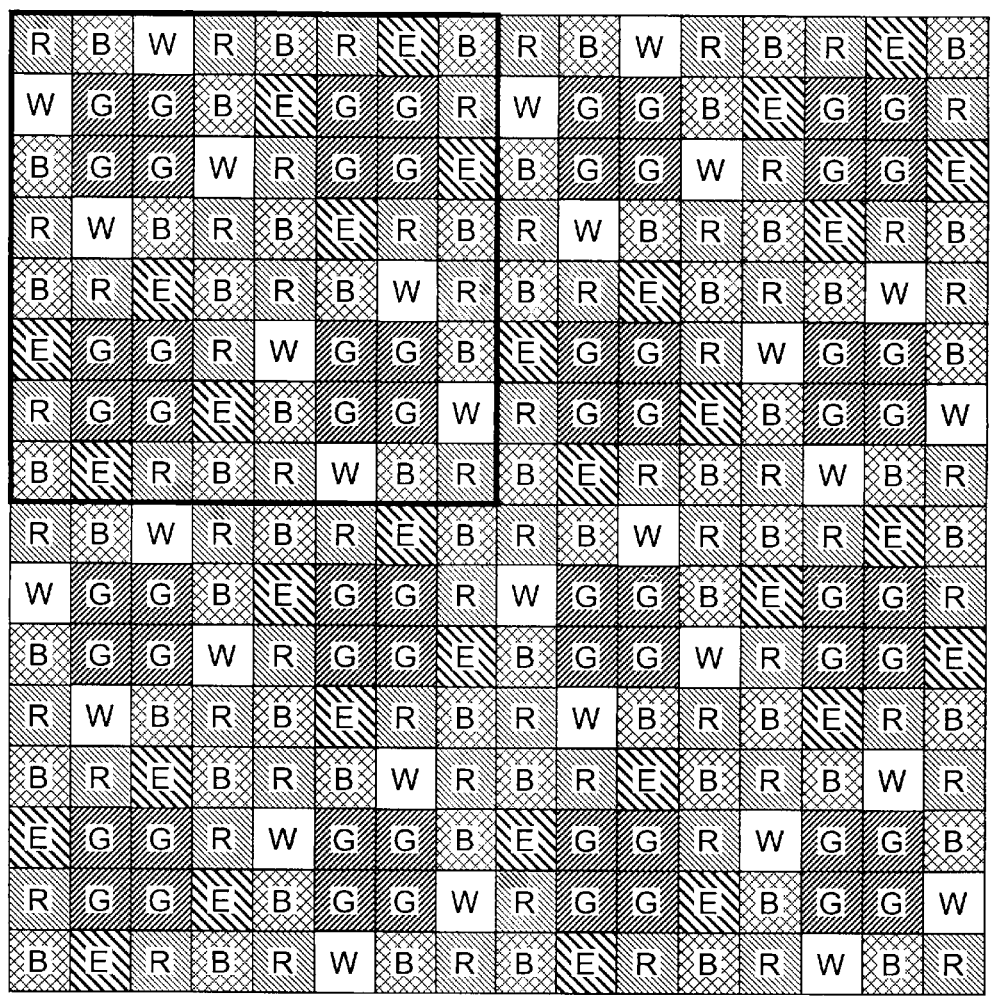
FIG. 17 illustrates a color filter arrangement according to a twelfth embodiment.

FIG. 17 illustrates a color filter arrangement according to a twelfth embodiment.

In the above-described color filter arrangements of the color imaging element according to the first to eleventh embodiments, the color filter arrangement includes the color filters of R, G, B and W. The color filter arrangement according to the twelfth embodiment is different in a point that the color filter arrangement includes the color filters of 5 colors including an E-filter of emerald (E) in addition to the R-, G-, B- and W-filters.

Compared to the color filter arrangement according to the eleventh embodiment, in the color filter arrangement according to the twelfth embodiment, a part of the W-filters is replaced by the E-filter.

In the color filter arrangement, at least one of the G-filter and the W-filter is disposed within each line of the color filter arrangement in the horizontal direction, the vertical direction, the oblique upper-right direction and the oblique lower-right direction; and within the basic arrangement pattern, one or more R-filters, B-filters and E-filters are disposed within each line of the color filter arrangement in the horizontal direction and the vertical direction.

In the basic arrangement pattern of the color filter arrangement according to the twelfth embodiment, within the basic arrangement pattern, the numbers of the R pixels, G pixels, B pixels, W pixels and E pixels corresponding to the R-, G-, B-, W- and E-filters are 16 pixels, 16 pixels, 16 pixels, 8 pixels and 8 pixels, respectively. That is, the ratio of the numbers of R, G+W, B and E pixels is 2:3:2:1. The ratio of the total number of the brightness-related pixels (G pixels and W pixels) is larger than the ratio of the respective numbers of the R pixels, the B pixels and the E pixels.

The color filter arrangement includes a tetragonal arrangement corresponding to the 2×2 pixels of the G-filters. The basic arrangement pattern is point symmetric with respect to the center of the basic arrangement pattern.

The color filter arrangement of the color imaging element according to the twelfth embodiment has the same features (1) to (6) as the color filter arrangement of the color imaging element according to the first embodiment.

As a modification of the color filter arrangement according to the twelfth embodiment, the position of the G-filter and the W-filter may be inverted each other. In this embodiment, the E-filter is a filter corresponding to the second color other than the brightness-related pixels (G pixels and W pixels). However, the E-filter may be a filter of the first color corresponding to the brightness-related pixels.

[Thirteenth Embodiment of the Color Imaging Element]

Figure 18:
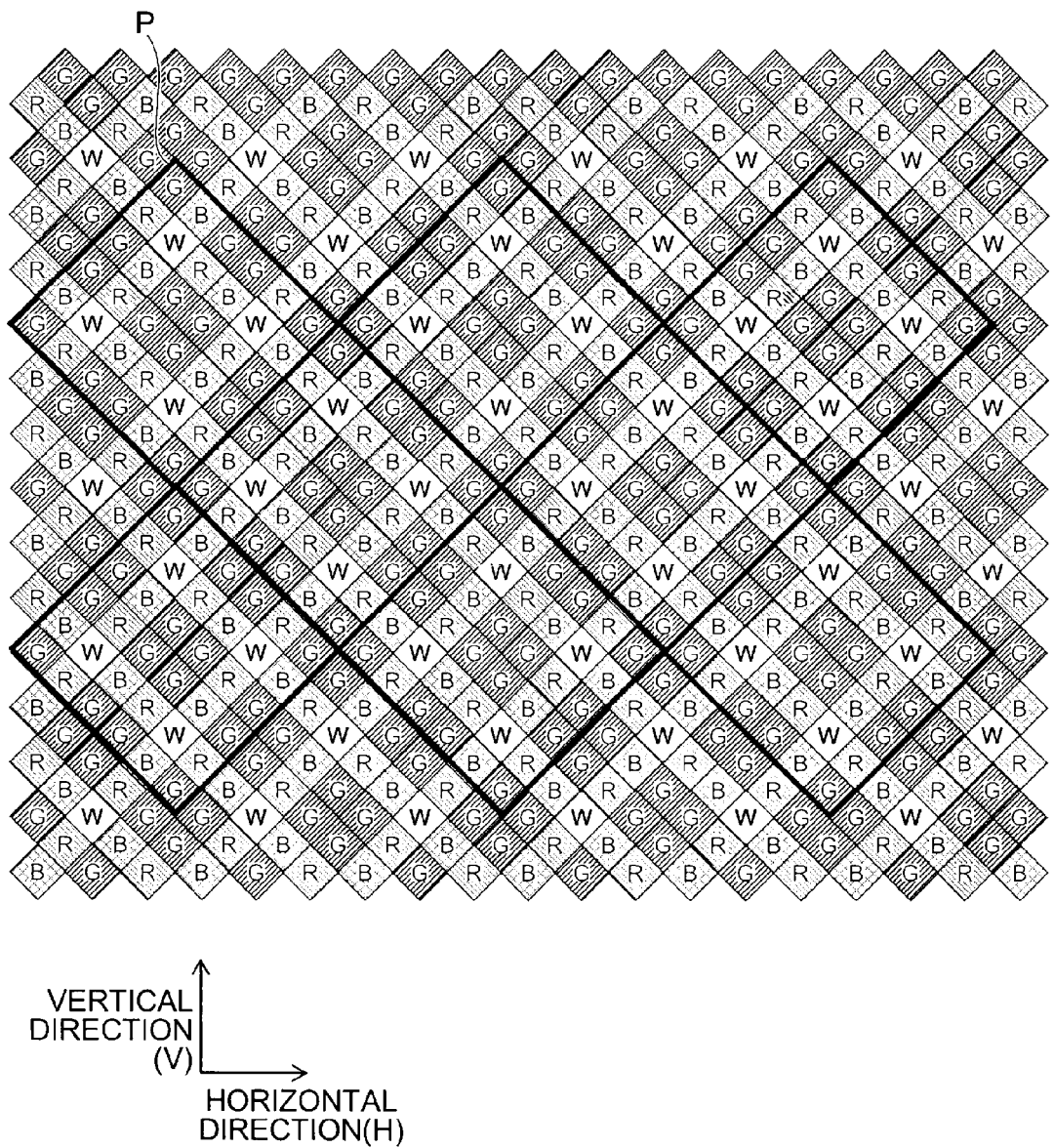
FIG. 18 illustrates a color filter arrangement according to a thirteenth embodiment.

FIG. 18 illustrates a color filter arrangement according to a thirteenth embodiment.

In any of the above-described color filter arrangements of the color imaging element according to the first to the twelfth embodiments, a plurality of pixels is applied to the imaging element which is arranged in a tetragonal grid state. The color filter arrangement of the color imaging element according to the thirteenth embodiment is different in a point that the color filter arrangement is applied to the color imaging element in which a plurality of pixels are arranged in an oblique grid state.

That is, the plurality of two-dimensionally arranged pixels of the color imaging element shown in FIG. 18 are arranged in an oblique grid state. With this, the pixels on a line in the horizontal direction, which abuts on each other, are disposed being displaced by ½ pixels in each line.

The color filter arrangement of the color imaging element shown in FIG. 18 includes a basic arrangement pattern (the pattern marked with a thick frame) including an oblique grid arrangement pattern corresponding to the 6×6 pixels. The basic arrangement pattern P is repeatedly disposed in the oblique grid state.

The color filter arrangement according to the thirteenth embodiment is equivalent to the color filter arrangement according to the first embodiment shown in FIG. 3, which is rotated by 45°.

Accordingly, the color filter arrangement according to the thirteenth embodiment is the same as the color filter arrangement according to the first embodiment in a point that at least one of the G-filter and the W-filter is disposed within each line of the color filter arrangement in the horizontal direction, the vertical direction, the oblique upper-right direction and the oblique lower-right direction.

Also, as in the basic arrangement pattern according to the first embodiment, since the color filter arrangement according to the thirteenth embodiment is equivalent to the color filter arrangement of the color imaging element according to the first embodiment shown in FIG. 3, which is rotated by 45°, within the basic arrangement pattern, the numbers of the R pixels, G pixels, B pixels and W pixels corresponding to R-, G-, B- and W-filters are 8 pixels, 16 pixels, 8 pixels and 4 pixels, respectively. That is, the ratio of the numbers of R, G+W and B pixels is 2:5:2; the ratio of the total number of the brightness-related pixels (G and W pixels) is larger than the ratio of the respective numbers of other colors, i.e. the R pixels and B pixels.

On the other hand, since the color filter arrangement according to the thirteenth embodiment is equivalent to the color filter arrangement according to the first embodiment, which is rotated by 45°, within the basic arrangement pattern, one or more R-filters and B-filters are disposed within each line of the color filter arrangement in the oblique upper-right direction and the oblique lower-right direction.

Figure 19:
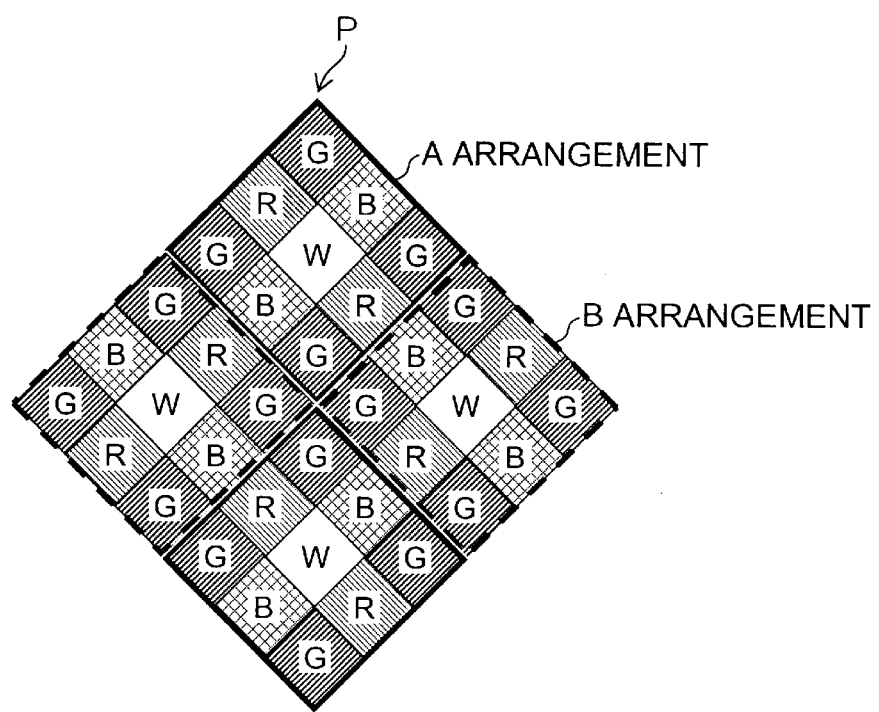
FIG. 19 illustrates a basic arrangement pattern in FIG. 18.

As shown in FIG. 19, it can be understood that the basic arrangement pattern P is configured by the A arrangement (oblique grid arrangement) of 3×3 pixels and the B arrangement (oblique grid arrangement) of the 3×3 pixels being arranged alternately.

In the A arrangement and the B arrangement, the G-filters each of which is the brightness-related pixel are disposed at the four corners, and the W-filter as the other brightness-related pixel is disposed at the center. That is, in the A arrangement and the B arrangement, the G-filter and the W-filter as the brightness-related pixels are disposed on both of the diagonal lines of 3×3 pixels. Also, in the A arrangement, the R-filters (R) are arranged in the horizontal direction and the B-filters are arranged in the vertical direction while the W-filter at the center is interposed therebetween. On the other hand, in the B arrangement, the B-filters are arranged in the horizontal direction and the R-filters are arranged in the vertical direction while the W-filter at the center is interposed therebetween. That is, in the A arrangement and the B arrangement, the positional relationship between the R-filter and the B-filter is inverted each other, but the other arrangement is identical.

The A arrangement and the B arrangement are alternately disposed in an oblique grid state. Therefore, the G-filters at the four corners in the A arrangement and the B arrangement form an oblique grid arrangement of G-filters corresponding to the 2×2 pixels (a crossed arrangement in which the 4 pixels abut on each other).

The reason for this is: in the A arrangement or the B arrangement, the G-filters as the brightness-related pixels are disposed at the four corners in the 3×3 pixels and the 3×3 pixels are disposed in an oblique grid state; thereby an oblique grid arrangement of G-filters corresponding to the 2×2 pixels is formed.

Further, the basic arrangement pattern P of the color filter arrangement shown in FIG. 19 is point symmetric with respect to the center (the center of four G-filters) of the basic arrangement pattern. Further, the A arrangement and the B arrangement within the basic arrangement pattern are also point symmetric with respect to the W-filter located at the center thereof.

With this symmetry, the circuit size of the subsequent processing circuit can be reduced or simplified.

As described above, since the color filter arrangement according to the thirteenth embodiment is equivalent to the color filter arrangement according to the first embodiment which is rotated by 45°, the color filter arrangement according to the thirteenth embodiment has the same features (1) to (6) as the color filter arrangement according to the first embodiment.

In the case of the imaging element in which the plurality of pixels are arranged in an oblique grid state, compared to an imaging element arranged in a tetragonal grid state, the reproducible band in the horizontal direction and the vertical direction is √2 times. This matches with the frequency characteristic of the human sense of sight, which is better in the horizontal direction and vertical direction than that in the oblique directions; thus it is a visually advantageous configuration.

In the case of the color imaging element in which a plurality of pixels are arranged in an oblique grid state as in the thirteenth embodiment, the oblique upper-right direction is equivalent to one direction of the first direction and the second direction according to the present invention; and the oblique lower-right direction is equivalent to the other direction of the first direction and the second direction according to the present invention.

<Spectral Sensitivity Characteristics of the R, G, B and W Pixels>

Figure 20:
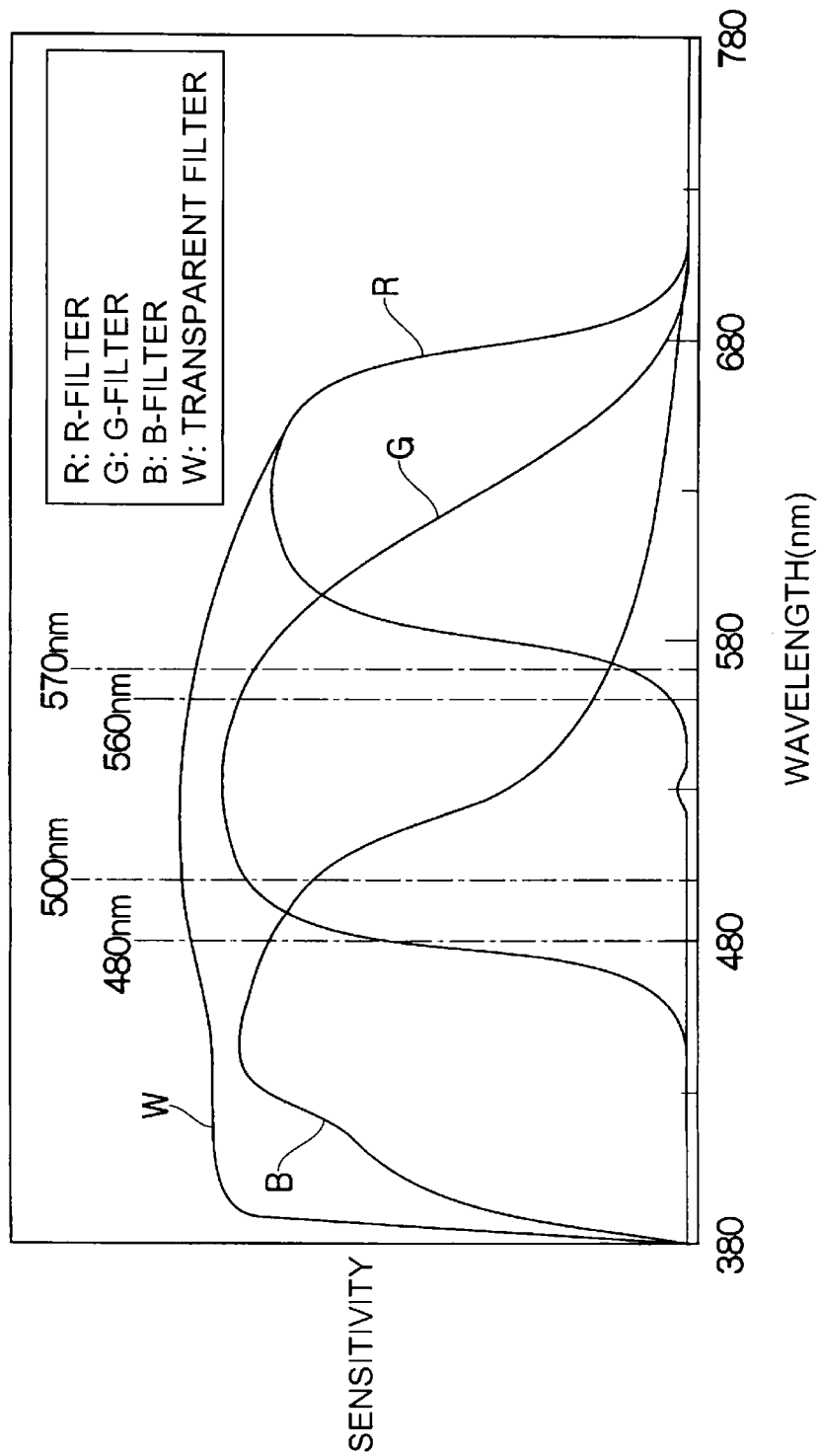
FIG. 20 is a graph showing spectral sensitivity characteristics of photodiodes each disposed with an R-filter, a G-filter, a B-filter and a W-filter.

FIG. 20 is a graph showing an example of spectral sensitivity characteristics of each photodiode (R, G, B and W pixels) having the R-filter, G-filter, B-filter and W-filter, respectively.

As shown in FIG. 20, the spectral sensitivity characteristic of a W pixel having a W-filter has a spectral sensitivity characteristic as if the respective spectral sensitivity characteristics of the R, G and B pixels are added; and the wavelength band of the sensitivity thereof includes the wavelength regions of the sensitivity of the R, G and B pixels.

The peak of the transmissivity of the W-filter (sensitivity peak of W pixel) is within a wavelength range of 480 nm or more and 570 nm or less. The transmissivity of the W-filter is within a wavelength range of 500 nm or more and 560 nm or less, which is higher than the transmissivity of the R-filter and B-filter.

The image signal of the G pixel has the contribution ratio when generating a brightness signal higher than that of the image signal of the R pixel and B pixel. To describe in particular, the image processing section 16 generates a Y signal from an RGB pixel signal which has color information on each R, G and B pixel in accordance with the following [Equation 1]:

$$Y=0.3R+0.59G+0.11B \qquad \text{[Equation 1]}$$

According to the [Equation 1], since the contribution ratio of the G color is 59%, the G color has the contribution ratio higher than that of the R color (the contribution ratio: 30%) and the B color (the contribution ratio: 11%). Therefore, the G color is the color that contributes most to the brightness signal in the three primary colors.

The image signal of the W pixel can be used as the brightness signal as it is. In the case of the color imaging element according to the above-described embodiments in which the G pixels and the W pixels are mixed, the brightness signal is generated by mixing a brightness signal calculated through the [Equation 1] and the image signal (brightness signal) of the W pixel at a certain ratio. The image signal of the W pixel is closer to the brightness signal than the image signal of the G pixel, and accordingly, closer to the brightness signal than the image signal of the R pixel and B pixel. For example, the image signal of the W pixel is calculated through the following formula.

$$Y=0.5W+0.5(0.3R+0.59G+0.11B) \qquad \text{[Equation 2]}$$

That is, the brightness-related pixels (G pixel and W pixel) corresponding to the first colors according to the present invention have the contribution ratio for obtaining a brightness signal is at least 50% or more; while each pixel (R pixel and B pixel) corresponding to the second colors other than the first colors have the contribution ratio for obtaining the brightness signal is less than 50%. Here, the value "50%" is a value which is defined for discriminating between the first colors and the second colors by using the contribution ratio for obtaining the brightness signal, and which is a value defined so that the color, the contribution ratio for obtaining the brightness signal of which is comparatively higher than that of the R color and B color, is included in the "first colors."

In the above-described embodiments, the description has been made while giving an example of the G-filter of G color and the transparent W-filter as the first filters which have the first colors according to the present invention. However, in place of the G-filter or a part of the G-filter, two or more filters which satisfy any one of the following conditions (1) to (4) may be used.

<Conditions of First Filters (First Colors)>
[Condition (1)]

As described above, the contribution ratio for obtaining a brightness signal should be 50% or more.

The contribution ratio of the colors other than the G color also can be obtained through an experiment or a simulation. Accordingly, a filter of a color other than the G color, which has the contribution ratio of 50% or more may be used as the first filters according to the present invention. A color, the contribution ratio of which is less than 50%, may be the second filters according to the present invention (R color, B color etc.), and a filter of such a color may be the second filters according to the present invention.

[Condition (2)]

The transmissivity peak of the filter should be within a wavelength range of 480 nm or more and 570 nm or less. As for the transmissivity of the filter, a value measured by, for example, a spectrophotometer may be used. This wavelength range is a range which is defined for discriminating between the first color (G color etc.) and the second color (R and B color etc.) according to the present invention. The range is defined so that the peak of R color or B color, the contribution ratio of which is comparatively low, is not included and the peak of the G color or the like, the contribution ratio of which is comparatively high is included. Therefore, a filter, the transmissivity peak of which is within a wavelength range of 480 nm or more and 570 nm or less, may be used as the first filters. A filter, the transmissivity peak of which is out of the range of wavelength 480 nm or more and 570 nm or less, may be used as the second filters according to the present invention (R-filter and B-filter).

[Condition (3)]

The transmissivity within a wavelength range of 500 nm or more and 560 nm or less should be higher than the transmissivity of the second filters (R-filter or B-filter). In the condition (3) also, for example, a value measured by a spectrophotometer may be used as the transmissivity of the filter. The wavelength range of the condition (3) is also a range defined for discriminating between the first color (G color etc.) and the second color (R and B color etc.) according to the present invention. The range is a range in which the transmissivity of a filter having a color, the contribution ratio of which is comparatively higher than that of the R color or B color, is higher than the transmissivity of the R- and B-filters. Therefore, within a wavelength range of 500 nm or more and 560 nm or less, a filter, the transmissivity of which is comparatively high, may be used as the first filters; while a filter, the transmissivity of which is comparatively low, may be used as the second filters.

[Condition (4)]

Filters of two or more colors, which include a color which contributes most to the brightness signal in the three primary colors (for example, G color in the R, G and B) and a color different from three primary colors should be used as the first filters. In this case, a filter corresponding to a color other than each color of the first filters should be used as the second filters.

<Transparent Filter (W-Filter)>

In the above-described embodiments, color filters which include R-, G-, B- and W-filters corresponding mainly to the R, G, B colors and a transparent color respectively have been described.

The W-filter is a filter of a transparent color (first color). The W-filter transmits the light corresponding to the wavelength band of the visible light. For example, a filter, the transmissivity of which to each color of R, G and B is 50% or more, is available. Since the transmissivity of the W-filter is higher than that of the G-filter, the contribution ratio for obtaining a brightness signal of the W-filter is also higher than that of the G color (59%); the condition (1) is satisfied accordingly.

FIG. 20 is a graph showing an example of the spectral sensitivity characteristics of the respective photodiodes having the R-filter, G-filter, B-filter and W-filter.

Referring to FIG. 20 showing the spectral sensitivity characteristics in the color filter arrangement (light-sensitive elements), the transmissivity peak of the W-filter (sensitivity peak of the white color pixel) is within a wavelength range of 480 nm or more and 570 nm or less. Also, the transmissivity of the W-filter within a wavelength range of 500 nm or more and 560 nm or less is higher than the transmissivity of the R- and B-filters. Therefore, the W-filter also satisfies the conditions (2) and (3). The G-filter also satisfies the conditions (1) to (3) as the W-filter.

Since the W-filter satisfies the conditions (1) to (3) as described above, the W-filter may be used as the first filters according to the present invention. In the color filter arrangement, since a part of the G-filters corresponding to the G color, which contributes most to the brightness signal in the three primary colors of R, G and B, is replaced by the W-filter, the condition (4) is also satisfied.

<Plural Kinds of First Filter (G-Filter)>

The G-filter of G color as the first filters is not limited to one kind. For example, plural kinds of G-filters may be used as the first filters. That is, the G-filter of the color filter (basic arrangement pattern) according to the above-described embodiments may be appropriately replaced by a G1-filter or G2-filter.

Figure 21:
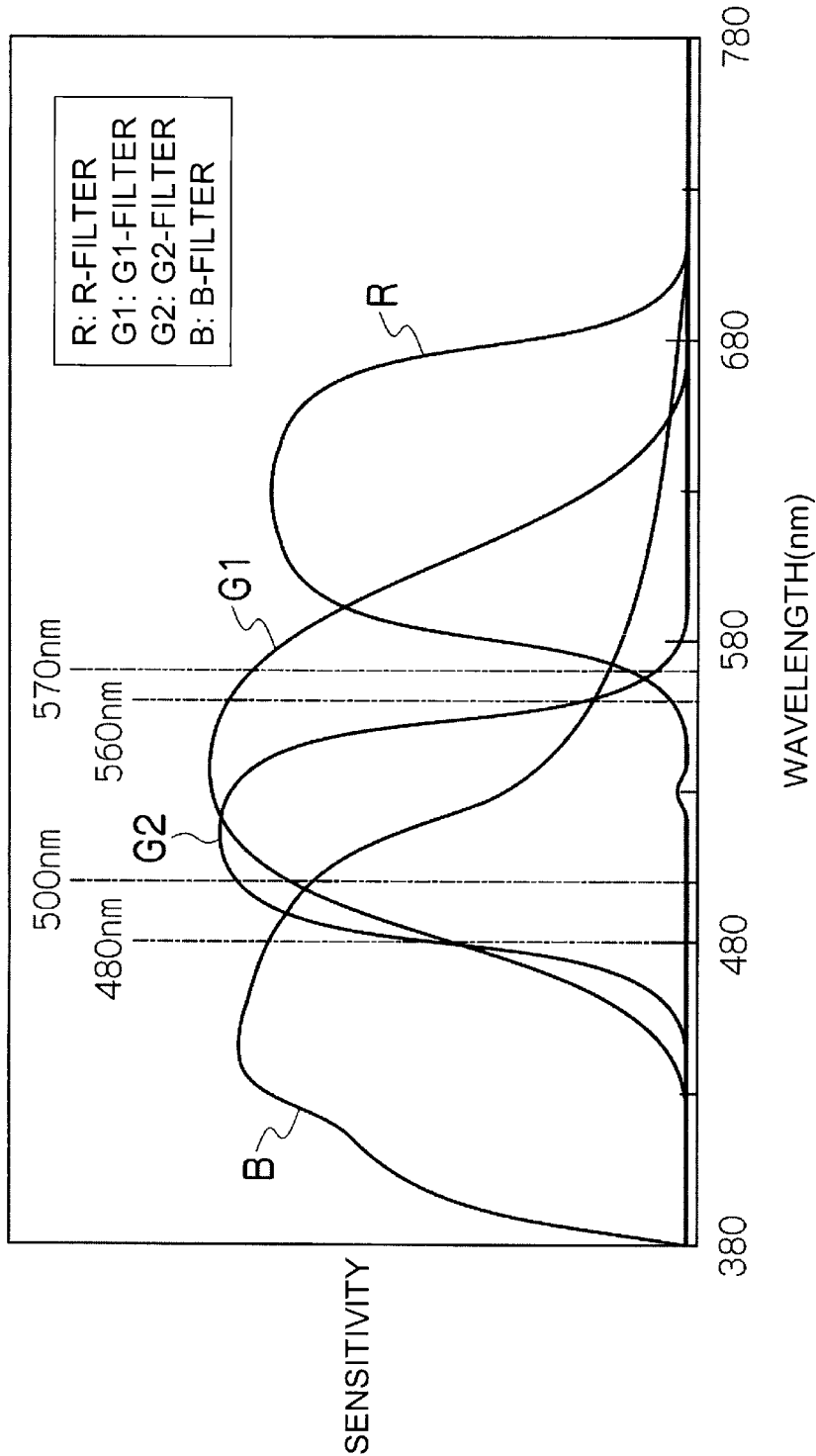
FIG. 21 is a graph showing spectral sensitivity characteristics of photodiodes each disposed with the R-filter, a G1 filter, a G2 filter and the B-filter.

FIG. 21 is a graph showing an example of spectral sensitivity characteristics of the respective photodiodes including the R-filter, G1-filter, G2-filter and B-filter. The G1-filter transmits G light in a first wavelength band; while the G2-filter transmits G light in a second wavelength band which has a high correlation with the G1-filter.

As for the G1-filter, an existing G-filter (for example, G-filter according to the first embodiment) may be used. As for the G2-filter, a filter which has a high correlation with the G1-filter may be used. In this case, the peak value of spectral sensitivity curve of a light-sensitive element, in which the G2-filter is disposed, is, for example, preferably within a wavelength range of 500 nm to 535 nm (adjacent to a peak value of the spectral sensitivity curve of the light-sensitive element in which existing G-filter is disposed). As for the method to determine the color filters of four colors (R, G1, G2 and B), for example, a method set forth in Japanese Patent Application Laid-Open No. 2003-284084 may be used.

As described above, by using four colors for the image obtained by the color imaging element to increase the color information obtained, compared to the case where only three kinds of colors (R, G and B) are obtained, the color can be represented more precisely. That is, colors which are recognized as different colors through the eyes is reproduced with different colors; while colors which are recognized as the identical color through the eyes are reproduced with identical color (the "epicritic performance of color" can be increased).

Since the transmissivity of the G1- and G2-filters is basically the same as the transmissivity of the G-filter according to the first embodiment, the contribution ratio for obtaining a brightness signal is higher than 50%. Therefore, the G1- and G2-filters satisfy the condition (1).

In FIG. 21 which shows spectral sensitivity characteristics in the color filter arrangement (light-sensitive elements), the transmissivity peak of the G1- and the G2-filters (sensitivity peak of each G pixel) is within a wavelength range of 480 nm or more and 570 nm or less. The transmissivity of the G1- and G2-filters within a wavelength range of 500 nm or more and 560 nm or less is higher than the transmissivity of the R- and B-filters. Therefore, the G1- and G2-filters also satisfy the conditions (2) and (3).

The arrangement and the number of the G1- and G2-filters may be appropriately changed. The kinds of the G-filter may be increased to 3 or more.

<Emerald Filter (E-Filter)>

FIG. 17 illustrates color filters according to the twelfth embodiment, which includes the color filters corresponding to colors of mainly R, G and B plus the transparent (W) color and the emerald (E) color. Particularly, in place of a part of the first filters (G-filters), the E-filter is preferably disposed. By using the color filter arrangement in which a part of the G-filters is replaced by the E-filter, the reproduction performance of the brightness in high area component is increased; the jaggedness is reduced, and the resolution can be increased.

Figure 22:
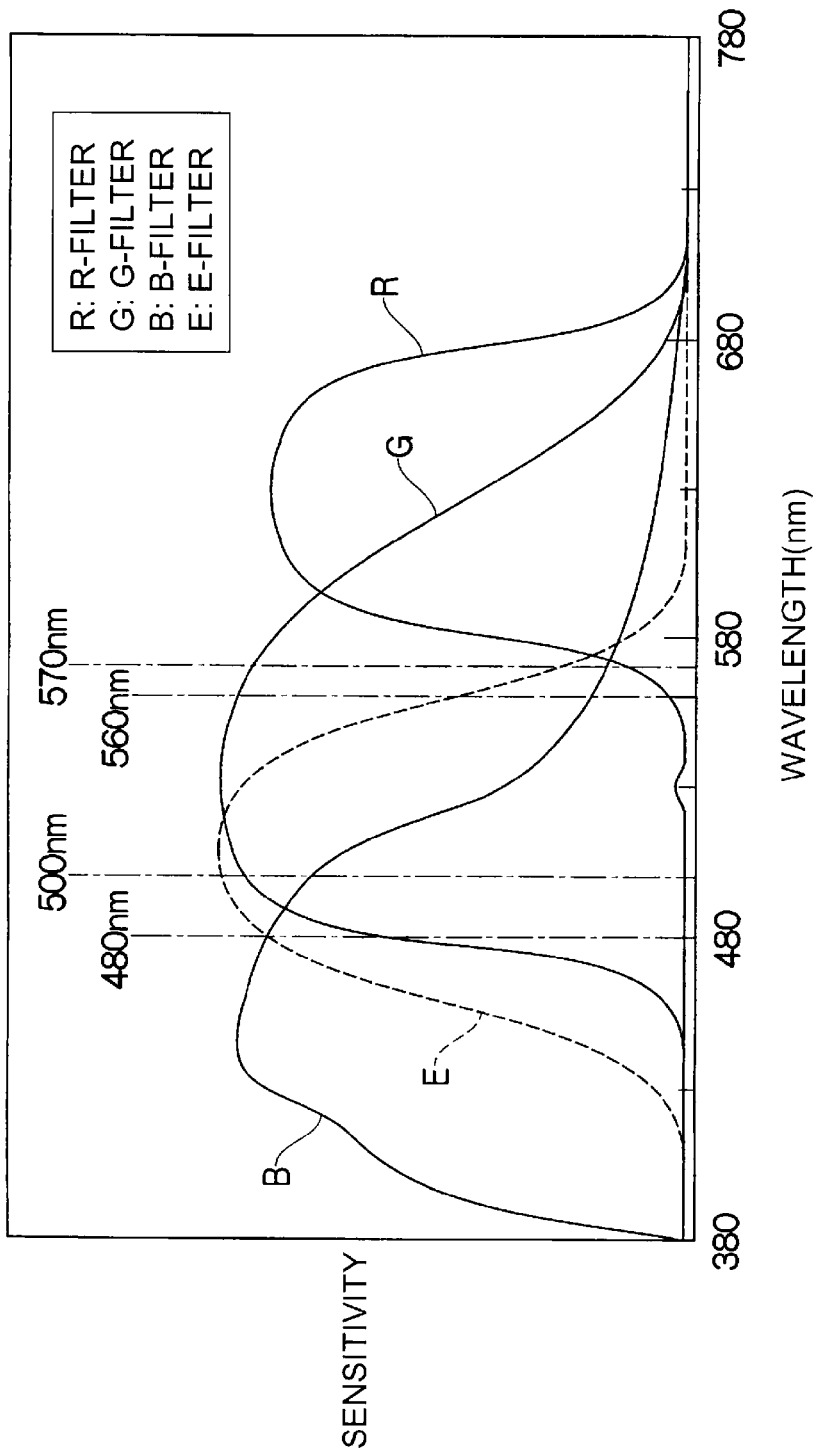
FIG. 22 is a graph showing spectral sensitivity characteristics of photodiodes each disposed with the R-filter, the G-filter, the B-filter and an E-filter.
Figure 23:
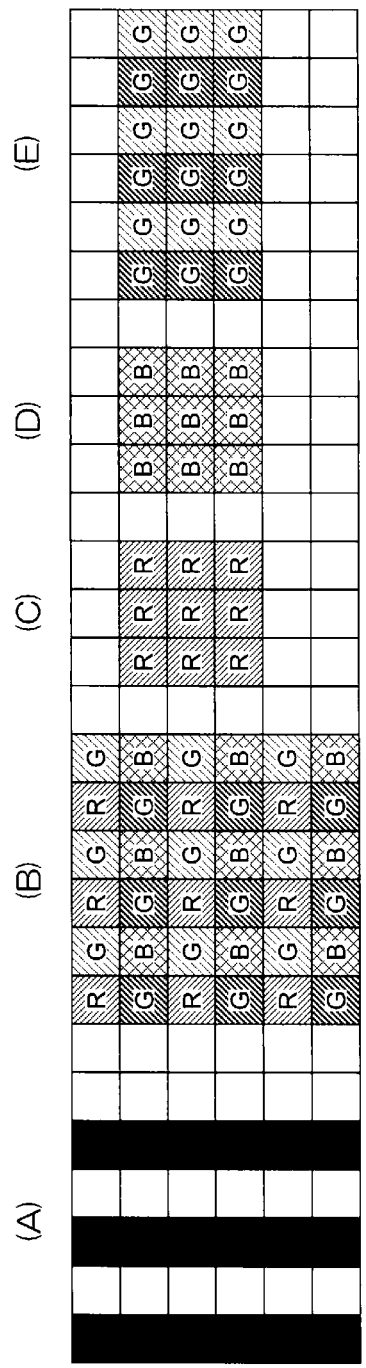
FIGS. 23A to 23E are illustrations for describing a problem of a conventional color imaging element which has a Bayer arrangement color filter.
Figure 24:
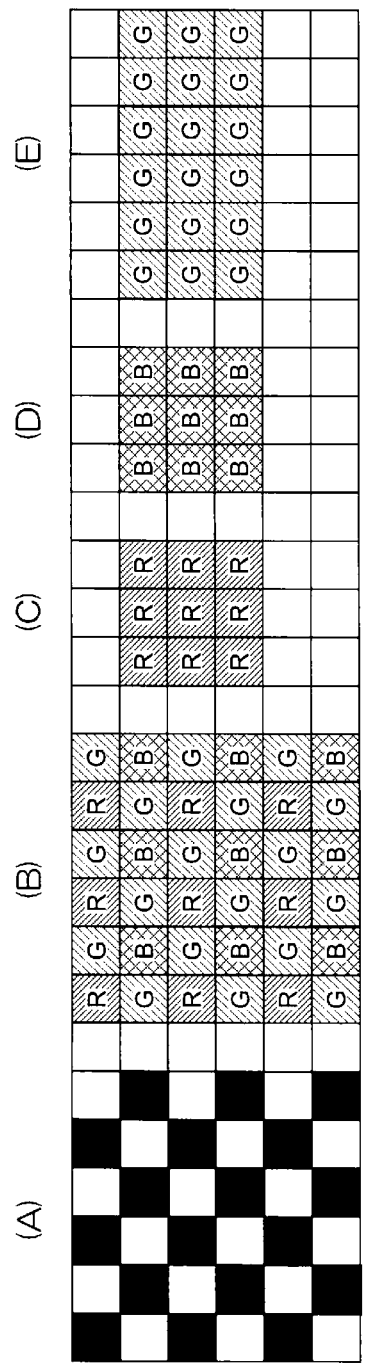
FIGS. 24A to 24E are another illustrations for describing the problem of the conventional color imaging element which has the Bayer arrangement color filter.

FIG. 22 is a graph showing an example of spectral sensitivity characteristics of the respective photodiodes having the R-filter, G-filter, B-filter and E-filter.

Referring to FIG. 21 which shows spectral sensitivity characteristics of the color filter arrangement (light-sensitive elements), the transmissivity peak of the E-filter (sensitivity peak of E pixel) is within a wavelength range of 480 nm or more and 570 nm or less. The transmissivity of the E-filter within a wavelength range of 500 nm or more and 560 nm or less is higher than the transmissivity of the R- and B-filters. Therefore, the E-filter satisfies the conditions (2), (3) and (4).

In the spectral characteristics shown in FIG. 22, the E-filter has the peak at the shorter wavelength side than the G-filter. However, there may be a case that the E-filter has the peak at the longer wavelength side than the G-filter (a color slightly yellow side). As for the E-filter, an E-filter which satisfies the conditions according to the present invention can be selected. For example, an emerald filter E which satisfies the condition (1) may be selected.

<Kinds of Other Colors>

In the above-described embodiments, color filter arrangements which include color filters of primary colors R, G and B have been described. The present invention is applicable to, for example, a color filter arrangement which includes color filters of four complementary colors of C (cyan), M (magenta), and Y (yellow), which are complementary colors of the primary colors R, G and B, and plus G. In this case also, color filters which satisfy any one of the conditions (1) to (4) are used as the first filters according to the present invention; while the other color filters are used as the second filters.

[Others]

In the above-described embodiments, descriptions have been made on the color filter arrangements which include color filters of four colors, i.e. three primary colors of R, G and B plus another color (for example, white (W), green (G2), emerald (E)). The kinds of the color filters are not limited to the above-described embodiments. For example, a filter which transmits the light in the infrared region (infrared cut filter is not disposed) and cuts the wavelength band of visible light may be used as another color filter.

Also, the present invention is applicable to a color filter arrangement including color filters of complementary four colors, i.e. C (cyan), M (magenta) and Y (yellow), which are complementary colors of the primary colors R, G and B, plus G.

Furthermore, in the color filter arrangements of the color imaging element according to the embodiments, a tetragonal basic arrangement pattern corresponding to N×N (N: an integer of 4 or more and 8 or less) pixels is repeatedly disposed in the horizontal direction and the vertical direction. However, the color filter arrangement may include a basic arrangement pattern corresponding to N×M (N, M: integers of 4 or more; N≠M) pixels which is repeatedly disposed in the horizontal direction and the vertical direction.

In the above-described embodiments, the description has been made on the color imaging element which is mounted on a digital camera. However, the present invention may be applied to a color imaging element which is mounted on various kinds of electronic devices (imaging devices) which have an imaging function, for example a smartphone, a cellphone, and a PDA.

The present invention is not limited to the above-described embodiments, and needless to say, various modifications are possible within a range of the spirit of the present invention.

What is claimed is:

1. A color imaging element of a single plate, comprising:
color filters disposed over a plurality of pixels each including a photoelectric conversion element arranged in a first direction and a second direction perpendicular to the first direction, wherein
an arrangement of the color filters has first filters corresponding to two or more first colors and second filters corresponding to two or more second colors, the second colors have a lower contribution ratio for obtaining a brightness signal than that of the first colors, the arrangement of the color filters includes a basic arrangement pattern in which the first filters and the second filters are arranged, the basic arrangement pattern is repeatedly disposed in the first direction and the second direction,
one or more of the first filters are disposed within each pixel line of the arrangement of the color filters in the first direction and the second direction and in a third direction and a fourth direction that are inclined with respect to the first direction and the second direction,
one or more of the second filters corresponding to each color of the second colors are disposed within each pixel line in the first direction and the second direction within the basic arrangement pattern, and
the ratio of the number of all pixels of the first colors corresponding to the first filters is larger than the ratio of the number of pixels of each color of the second colors corresponding to the second filters.

2. A color imaging element of a single plate, comprising:
color filters disposed over a plurality of pixels each including a photoelectric conversion element arranged in a first direction and a second direction perpendicular to the first direction, wherein
an arrangement of the color filters has first filters corresponding to two or more first colors, a transmissivity peak of which is within a wavelength range of 480 nm or more and 570 nm or less, and second filters corresponding to two or more second colors a transmissivity peak of which is out of the range, and includes a basic arrangement pattern in which the first filters and the second filters are arranged, the basic arrangement pattern is repeatedly disposed in the first direction and the second direction,
one or more of the first filters are disposed within each pixel line of the arrangement of the color filters in the first direction and the second direction and in a third direction and a fourth direction that are inclined with respect to the first direction and the second direction,
one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

3. A color imaging element of a single plate, comprising:

color filters disposed over a plurality of pixels each including a photoelectric conversion element arranged in a first direction and a second direction perpendicular to the first direction, wherein an arrangement of the color filters has first filters corresponding to two or more first colors and second filters corresponding to two or more second colors, a transmissivity of which is lower than a transmissivity of the first filters within a wavelength range of 500 nm or more and 560 nm or less, and includes a basic arrangement pattern in which the first filters and the second filters are arranged, the basic arrangement pattern is repeatedly disposed in the first direction and the second direction, one or more of the first filters are disposed within each pixel line of the arrangement of the color filters in the first direction and the second direction and in a third direction and a fourth direction that are inclined with respect to the first direction and the second direction, one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

4. A color imaging element of a single plate, comprising:

color filters disposed over a plurality of pixels each including a photoelectric conversion element arranged in a first direction and a second direction perpendicular to the first direction, wherein an arrangement of the color filters has first filters corresponding to two or more first colors, which includes a color that most contributes to a brightness signal in three primary colors and a fourth color different from the three primary colors, and second filters corresponding to two or more second colors other than the first colors, and includes a basic arrangement pattern in which the first filters and the second filters are arranged, the basic arrangement pattern is repeatedly disposed in the first direction and the second direction, one or more of the first filters are disposed within each pixel line of the arrangement of the color filters in the first direction and the second direction and in a third direction and a fourth direction that are inclined with respect to the first direction and the second direction, one or more of the second filters corresponding to each color of the second colors are disposed within each pixel line in the first direction and the second direction within the basic arrangement pattern, and the ratio of the number of all pixels of the first colors corresponding to the first filters is larger than the ratio of the number of pixels of each color of the second colors corresponding to the second filters.

5. The color imaging element according to claim 1, wherein the contribution ratio of the first colors for obtaining a brightness signal is 50% or more, and the contribution ratio of the second colors for obtaining the brightness signal is less than 50%.

6. The color imaging element according to claim 1, wherein the arrangement of the color filters includes a portion where the first filters continue for 2 pixels or more within each pixel line in the first direction, the second direction, the third direction and the fourth direction.

7. The color imaging element according to claim 1, wherein the arrangement of the color filters includes 2×2 pixels of the first filters as the pixels in the first direction and the second direction.

8. The color imaging element according to claim 1, wherein the arrangement of the color filters within the basic arrangement pattern is point symmetric with respect to the center of the basic arrangement pattern.

9. The color imaging element according to claim 1, wherein the basic arrangement pattern is an arrangement pattern in which the pixels in the first direction and the second direction correspond to N×N (N: an integer of 4 or more and 8 or less) pixels.

10. The color imaging element according to claim 9, wherein the basic arrangement pattern is an arrangement pattern in which the pixels in the first direction and the second direction correspond to 6×6 pixels.

11. The color imaging element according to claim 1, wherein, in the arrangement of the color filters, the first filters are disposed at the center and the four corners in a 3×3 pixel group, and the 3×3 pixel group is repeatedly disposed in the first direction and the second direction.

12. The color imaging element according to claim 11, wherein the first filters corresponding to any one color of the first colors are disposed at the center of the 3×3 pixel group, and the first filters corresponding to the other color of the first colors are disposed at the four corners of the 3×3 pixel group.

13. The color imaging element according to claim 1, wherein one or more of the second filters are disposed within each pixel line of the arrangement of the color filters in the first direction, the second direction, the third direction and the fourth direction.

14. The color imaging element according to claim 1, wherein the first colors include two or more colors of a first green (G), a second G having a wavelength band different from that of the first G and white (W), and the second colors include colors of red (R) and blue (B).

15. The color imaging element according to claim 14, wherein the basic arrangement pattern is an arrangement pattern in which the pixels in the first direction and the second direction correspond to 6×6 pixels, and the arrangement of the color filters is configured by a first arrangement corresponding to the 3×3 pixels and a second arrangement corresponding to the 3×3 pixels being alternately arranged in the first direction and the second direction, wherein in the first arrangement, the first filters corresponding to the first G, the second G or W are disposed at the center and the four corners, and the second filters corresponding to B are disposed in the first direction and the second filters corresponding to R are arranged in the second direction with the first filters at the center interposed therebetween, and wherein in the second arrangement, the first filters corresponding to the first G, the second G or W are disposed at the center and the four corners, and the second filters corresponding to R are disposed in the first direction and the second filters corresponding to B are arranged in the second direction with the first filters at the center interposed therebetween.

16. An imaging apparatus, comprising:
an imaging optical system;
a color imaging element on which an image of an object is formed by the imaging optical system;
an image data generating device which generates image data indicating the formed image of the object,
wherein the color imaging element is the color imaging element according to claim 1.

* * * * *